United States Patent
Seo et al.

(10) Patent No.: US 9,563,503 B2
(45) Date of Patent: ***Feb. 7, 2017

(54) NONVOLATILE MEMORY SYSTEM AND RELATED METHOD OF OPERATION

(71) Applicant: SAMSUNG ELECTRONICS CO., LTD., Suwon-si, Gyeonggi-do (KR)

(72) Inventors: Dong-Young Seo, Suwon-si (KR); Dukyoung Yun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 14 days.

This patent is subject to a terminal disclaimer.

(21) Appl. No.: 14/718,907

(22) Filed: May 21, 2015

(65) Prior Publication Data

US 2015/0262694 A1 Sep. 17, 2015

Related U.S. Application Data

(63) Continuation of application No. 14/645,687, filed on Mar. 12, 2015.

(30) Foreign Application Priority Data

Mar. 14, 2014 (KR) ........................ 10-2014-0030284

(51) Int. Cl.
| | |
|---|---|
| *G11C 16/28* | (2006.01) |
| *G06F 11/10* | (2006.01) |
| *G11C 29/04* | (2006.01) |
| *G11C 16/04* | (2006.01) |
| *G11C 11/56* | (2006.01) |
| *G11C 29/02* | (2006.01) |

(Continued)

(52) U.S. Cl.
CPC ....... *G06F 11/1068* (2013.01); *G06F 11/1048* (2013.01); *G06F 12/00* (2013.01); *G11C 11/5642* (2013.01); *G11C 16/0483* (2013.01); *G11C 16/28* (2013.01); *G11C 29/021* (2013.01); *G11C 29/028* (2013.01); *G11C 7/14* (2013.01)

(58) Field of Classification Search
None
See application file for complete search history.

(56) References Cited

U.S. PATENT DOCUMENTS

| | | |
|---|---|---|
| 7,257,025 B2 | 8/2007 | Maayan et al. |
| 7,843,723 B2 | 11/2010 | Shibata |
| 7,889,563 B2 | 2/2011 | Cho et al. |

(Continued)

FOREIGN PATENT DOCUMENTS

KR     1020150107399 A     9/2015

*Primary Examiner* — Justin R Knapp
(74) *Attorney, Agent, or Firm* — Volentine & Whitt, PLLC

(57) ABSTRACT

A system comprises a nonvolatile memory device comprising a memory cell array comprising a plurality of memory blocks each comprising a plurality of cell strings, each of cell strings comprises the plurality of memory cells stacked in a direction perpendicular to a substrate, a ground selection transistor disposed between the memory cells and the substrate, and a string selection transistor disposed between the memory cells and a bitline, and configured to read stored data from the memory cells using a plurality of read voltages; and a memory controller configured to read the memory cells using a reference voltage to generate on-cell data, and adjust the read voltages of the nonvolatile memory device based on the generated on-cell data.

18 Claims, 18 Drawing Sheets

(51) Int. Cl.
   *G06F 12/00*      (2006.01)
   *G11C 7/14*       (2006.01)

(56)             References Cited

U.S. PATENT DOCUMENTS

| | | | |
|---|---|---|---|
| 7,898,865 | B2 | 3/2011 | Baek et al. |
| 8,248,856 | B2 | 8/2012 | Goss et al. |
| 8,397,131 | B1 | 3/2013 | Sommer et al. |
| 8,510,636 | B2 | 8/2013 | Ruby et al. |
| 2009/0310404 | A1* | 12/2009 | Cho .................. G11C 7/06 |
| | | | 365/185.2 |
| 2010/0232229 | A1 | 9/2010 | Ogawa et al. |
| 2012/0008401 | A1* | 1/2012 | Katz .................. G11C 16/26 |
| | | | 365/185.18 |
| 2012/0069666 | A1 | 3/2012 | Fukuda |
| 2012/0102259 | A1* | 4/2012 | Goss .................. G11C 7/04 |
| | | | 711/103 |
| 2012/0166708 | A1* | 6/2012 | Chung .............. G06F 12/0246 |
| | | | 711/103 |
| 2012/0254699 | A1* | 10/2012 | Ruby .................. G06F 11/1048 |
| | | | 714/773 |
| 2012/0294104 | A1 | 11/2012 | Mun et al. |
| 2013/0016562 | A1* | 1/2013 | Mun .................. G11C 11/5628 |
| | | | 365/185.12 |
| 2013/0139036 | A1 | 5/2013 | Lee |
| 2013/0194883 | A1* | 8/2013 | Lee .................. G11C 29/04 |
| | | | 365/201 |
| 2014/0198567 | A1* | 7/2014 | Mokhlesi .............. G11C 11/5642 |
| | | | 365/185.03 |
| 2015/0262697 | A1 | 9/2015 | Kim |

\* cited by examiner

113

| Number of On-Cell | Read Voltage |
|---|---|
| 1st Period | Vrd11 ~ Vrd71 |
| 2nd Period | Vrd12 ~ Vrd72 |
| ⋮ | ⋮ |
| n-1th Period | Vrd1n-1 ~ Vrd7n-1 |
| nth Period | Vrd1n ~ Vrd7n |

| # of on-cell | Elapsed Program Time |
|---|---|
| 1st Period | EPT1 |
| 2nd Period | EPT2 |
| 3rd Period | EPT3 |
| ⋮ | ⋮ |
| nth Period | EPTn |

| PBN | Record of adjusted read level |
|---|---|
| BLK1 | 0 |
| BLK2 | 1 |
| BLK3 | 1 |
| ⋮ | ⋮ |
| BLKn | 0 |

FIG. 17

| PBN | Record of adjusted read level |
|---|---|
| BLK1 | 0 |
| BLK2 | 1 |
| BLK3 | 1 |
| ... | ... |
| BLKn | RCn |

214

| Word Line | PT |
|---|---|
| WL1 | PT1 |
| WL2 | PT2 |
| WL3 | PT3 |
| ... | ... |
| WLm | PTm |

NONVOLATILE MEMORY SYSTEM AND RELATED METHOD OF OPERATION

CROSS-REFERENCE TO RELATED APPLICATIONS

This is a Continuation of co-pending U.S. application Ser. No. 14/645,687, filed Mar. 12, 2015, which makes a claim of priority under 35 USC §119 to Korean Patent Application No. 10-2014-0030284 filed on Mar. 14, 2014, the subject matter of which is hereby incorporated by reference.

BACKGROUND OF THE INVENTION

Embodiments of the inventive concept relate generally to semiconductor memories and, more particularly, to nonvolatile memory systems and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include read only memory (ROM), magnetoresistive random access memory (MRAM), resistive random access memory (RRAM), and flash memory.

Flash memory is an especially popular form of nonvolatile memory due to attractive features such as relatively high storage density, efficient performance, low cost per bit, and an ability to withstand physical shock. Some flash memories include charge trap flash (CTF) memory cells. A CTF memory cell stores charges in a charge storage layer to represent a program state.

A threshold voltage distribution of CTF memory cells may vary due to charges flowing into a channel after the CTF memory cells are programmed. This physical characteristic may distort stored data by changing the threshold voltage distributions of stored data. However, such distortion can be compensated for by controlling and/or monitoring program time of memory cells. For instance, if the threshold voltage distribution of a group of memory cells is deemed to be distorted based on a monitored program time of those memory cells, certain parameters of read operations can be adjusted to take into account the distortion. Unfortunately, the control and/or monitoring of program time of the memory cells may require a separate storage area and may also increase the amount of time required to perform read operations.

SUMMARY OF THE INVENTION

In one embodiment of the inventive concept a system comprising a nonvolatile memory device comprising a memory cell array comprising a plurality of memory blocks each comprising a plurality of cell strings, each of cell strings comprises the plurality of memory cells stacked in a direction perpendicular to a substrate, a ground selection transistor disposed between the memory cells and the substrate, and a string selection transistor disposed between the memory cells and a bitline, and configured to read stored data from the memory cells using a plurality of read voltages; and a memory controller configured to read the memory cells using a reference voltage to generate on-cell data, and adjust the read voltages of the nonvolatile memory device based on the generated on-cell data.

In another embodiment of the inventive concept, a method is provided for operating a system comprising a nonvolatile memory device and a memory controller. The method comprises reading data stored in the nonvolatile memory device using a plurality of read voltages; reading memory cells storing the data based on a reference voltage to generate on-cell data, wherein the data contains an uncorrectable error; adjusting the read voltages based on the generated on-cell data; and re-reading the data stored in the nonvolatile memory device using the adjusted read voltages. The nonvolatile memory device comprises a memory cell array comprising a plurality of memory blocks each comprising a plurality of cell strings, and each of cell strings comprises a plurality of memory cells stacked in a direction perpendicular to a substrate, a ground selection transistor disposed between the memory cells and the substrate, and a string selection transistor disposed between the memory cells and a bitline.

In still another embodiment of the inventive concept, a nonvolatile memory system comprises at least one flash memory comprising a memory cell array including a plurality of memory blocks each comprising a plurality of cell strings, each of cell strings comprises the plurality of memory cells stacked in a direction perpendicular to a substrate, a ground selection transistor disposed between the memory cells and the substrate, and a string selection transistor disposed between the memory cells and a bitline, and configured to read stored data from the memory cells using a plurality of read voltages; a volatile memory including an on-cell and elapsed program time look-up table indicating a relationship between the number of on-cells and elapsed program time; and a memory controller configured to read the memory cells using a reference voltage to generate on-cell data, and adjust the read voltages of the at least one flash memory based on the generated on-cell data and the on-cell and elapsed program time look-up table.

These and other embodiments of the inventive concept can potentially improve the reliability of nonvolatile memory devices by addressing and/or preventing certain types of errors that may occur in stored data.

BRIEF DESCRIPTION OF THE DRAWINGS

Embodiments of the inventive concept are described below with reference to the accompanying drawings. These embodiments are presented as teaching examples and should not be construed to limit the scope of the inventive concept.

FIG. 15 illustrates an on-cell and elapsed program time look-up table in FIG. 13 according to an embodiment of the inventive concept.

FIG. 16 illustrates a program time managing unit in FIG. 13.

FIG. 17 further illustrates the program time managing unit in FIG. 13.

DETAILED DESCRIPTION

Embodiments of the inventive concept are described below with reference to the accompanying drawings. These embodiments are presented as teaching examples and should not be construed to limit the scope of the inventive concept.

A memory controller according to an embodiment of the inventive concept may detect elapsed program time of a read page by performing an on-cell counting operation when an uncorrectable error (hereinafter, an "Uncorrectable Error Correction Code [UECC] error") occurs during a read operation. A memory controller adjusts a level of a read voltage of a nonvolatile memory device, based on detected elapsed program time. Thus, utilization of capacity of the nonvolatile memory device may be improved without separately storing the elapsed program time. In addition, because a UECC error caused by IVS may be reduced, a nonvolatile memory system with improved reliability is provided.

Figure 1:
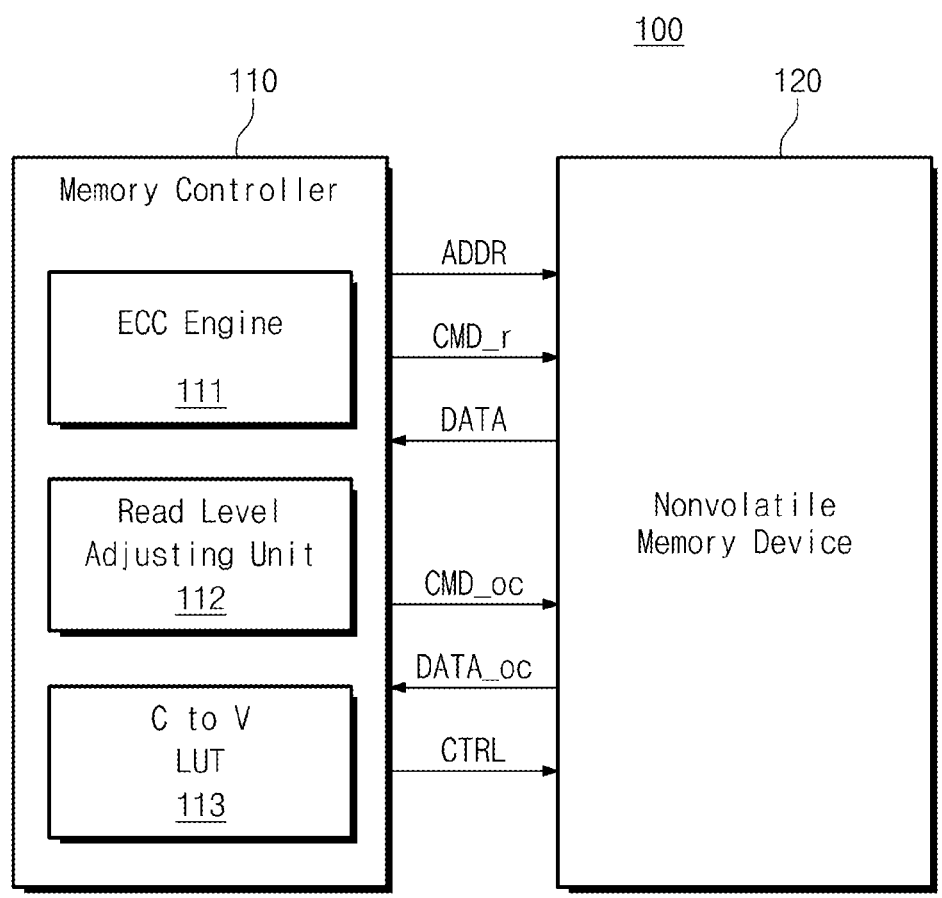
FIG. 1 is a block diagram of a nonvolatile memory system according to an embodiment of the inventive concept.

FIG. 1 is a block diagram of a nonvolatile memory system 100 according to an embodiment of the inventive concept.

Referring to FIG. 1, nonvolatile memory system 100 comprises a memory controller 110 and a nonvolatile memory device 120.

Memory controller 110 controls nonvolatile memory device 120. For example, memory controller 110 may transmit an address ADDR and a read command CMD_r to read data stored in nonvolatile memory device 120.

Nonvolatile memory device 120 operates under the control of the memory controller 110. For example, the nonvolatile memory device 120 may receive address ADDR and read command CMD_r from memory controller 110. Nonvolatile memory device 120 transmits data corresponding to the received address ADDR to memory controller 110 in response to the received read command CMD_r.

Memory controller 110 comprises an error correction code (ECC) engine 111, a read level adjusting unit 112, and an on-cell to read voltage look-up table (C to V LUT) 113.

ECC engine 111 generates an error correction code for data to be stored in nonvolatile memory device 120. In some embodiments, the generated error correction code is stored in a spare area of nonvolatile memory device 120. ECC engine 111 detects and/or corrects an error of the data read from nonvolatile memory device 120, based on the error correction code. In some embodiments, data received from nonvolatile memory device 120 comprises an error correction code and user data.

Data DATA received from nonvolatile memory device 120 may include a UECC error. In this case, memory controller 110 may perform an on-cell counting operation. For example, where an error is not corrected by an error correct operation of ECC engine 110 (i.e., the UECC error is occurred), memory controller 110 may transmit an on-cell counting command CMD_oc and an address ADDR to nonvolatile memory device 120.

Nonvolatile memory device 120 may perform a read operation only once on memory cells corresponding to the received address ADDR, based on a reference voltage, in response to on-cell counting command CMD_oc. Hereinafter, data read based on the on-cell counting operation by nonvolatile memory device 120 will be referred to as on-cell data DATA_oc. Nonvolatile memory device 120 transmits read on-cell data DATA_oc to memory controller 110.

Read level adjusting unit 112 detects the number of on-cells, based on the received on-cell data DATA_oc. Read level adjusting unit 112 adjusts a level of a read voltage of nonvolatile memory device 120, based on the detected number of on-cells and C to V LUT 113. In some embodiments, the on-cells indicate a memory cell turned-on by the reference voltage. That is, threshold voltages of the on-cells are lower than the reference voltage.

C to V LUT 113 may comprise information representing a relationship between the number of on-cells and the read voltage. In some embodiments, memory controller 110 transmits a control signal CTRL to nonvolatile memory device 120 to adjust a level of the read voltage of nonvolatile memory device 120. Nonvolatile memory device 120 may adjust a level of the read voltage in response to the control signal CTRL.

In some embodiments, read level adjusting unit 112 may detect elapsed program time of memory cells based on the detected number of on-cells. Read level adjusting unit 112 may adjust a level of the read voltage of nonvolatile memory device 120 based on the detected elapsed program time.

The above-described operation of nonvolatile memory system 100, i.e., the operation of detecting the number of on-cells based on on-cell data DATA_oc, will be referred to as an "on-cell counting operation". Nonvolatile memory device 100 may perform the on-cell counting operation to adjust the read voltage of nonvolatile memory device 120. The on-cell counting operation of nonvolatile memory system 100 will be explained below in further detail with reference to accompanying drawings.

Figure 2:
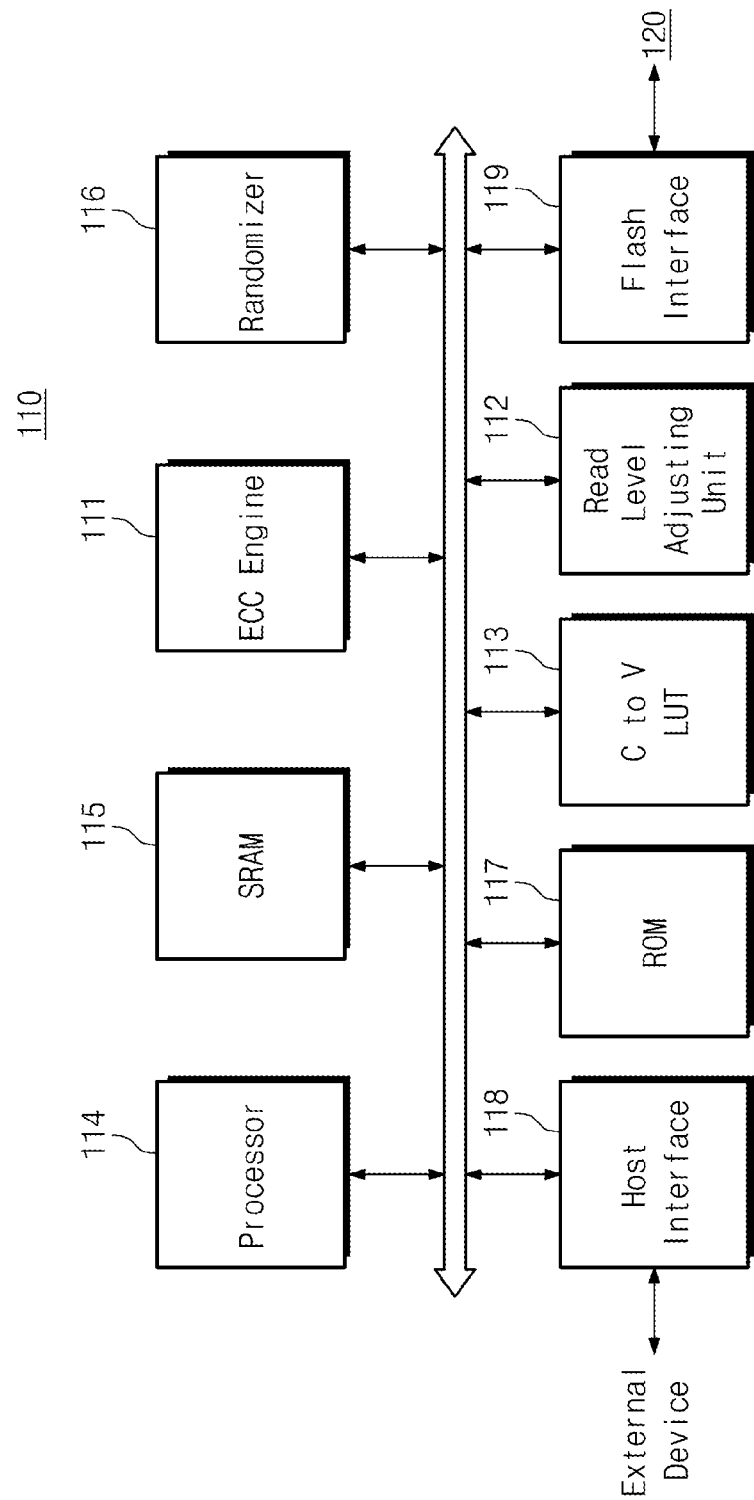
FIG. 2 is a block diagram of a memory controller in FIG. 1 according to an embodiment of the inventive concept.

FIG. 2 is a block diagram of memory controller 110 in FIG. 1.

Referring to FIGS. 1 and 2, memory controller 110 comprises an ECC engine 111, a read level adjusting unit 112, C to V LUT 113, a processor 114, an SRAM 115, a randomizer 116, a host interface 118, and a flash interface 119.

ECC engine 111 generates an error correction code for data to be written to nonvolatile memory device 120. ECC engine 111 may detect an error of the data read from nonvolatile memory device 120 based on the error correction code and may correct the detected error.

Read level adjusting unit 112 adjusts a level of the read voltage of nonvolatile memory device 120 based on on-cell data DATA_oc received from nonvolatile memory device 120 when an uncorrectable error is detected by an error correct operation of ECC engine 111 (i.e., UECC error). For example, read level adjusting unit 112 may determine the level of the read voltage based on on-cell data DATA_oc and C to V LUT 113. Read level adjusting unit 112 may transmit the control signal CTRL to nonvolatile memory device 120 such that nonvolatile memory device 120 operates at the determined level of the read voltage.

C to V LUT 113 comprises information representing a relationship between the number of on-cells and the read voltage. In some embodiments, C to V LUT 113 may be managed in units of memory blocks. C to V LUT 113 may be determined in advance or updated according to a position of a memory block, the number of program/erase (P/E) cycle of the memory block, characteristics of the memory block. In some embodiments, C to V LUT 113 may be managed in units of wordlines. C to V LUT 113 may be determined in advance or updated according to a position of a wordline.

In some embodiments, C to V LUT 113 is stored in a ROM 117 in the form of firmware. Alternatively, C to V LUT 113 may be stored in SRAM 115 and may be updated by processor 114. An updated C to V LUT 113 of processor 114 may be flushed to nonvolatile memory device 120.

Processor 114 controls the overall operation of memory controller 110. Processor 114 may drive firmware stored in ROM 117. In some embodiments, read level adjusting unit 112 may be implemented using software and may be drive according to the control of processor 114.

SRAM 115 may operate as a buffer memory, a cache memory, a working memory or a main memory of the memory controller 115. In some embodiments, SRAM 115 stores C to V LUT 113.

Randomizer 116 randomizes data to be stored in the novolatile memory device 120. For example, nonvolatile memory device 120 may write data in units of pages. Memory cells of nonvolatile memory device 120 may be multi-level cells (MLCs) to store two or more bits of data. In this case, each of the memory cells may be programmed to have one of an erase state and a plurality of program states. Randomizer 116 may randomize data such that ratios of respective program states of memory cells connected to a single wordline are equal to each other. To put it another way, when randomized data is stored in memory cells connected to a single wordline, the number of memory cells in an erase state and the number of memory cells in the respective program states may be equal to each other.

ROM 117 may store various types of information required to operate memory controller 110 in the form of firmware. Memory controller 110 communicates with an external device (e.g., host, application processor, etc.) through host interface 118, which may take a form such as a Universal Serial Bus (USB), multimedia card MMC), a peripheral component interconnection (PCI), a PCI-express (PCI-E), an Advanced Technology Attachment (ATA), a Serial-ATA, a Parallel-ATA, a small computer small interface (SCSI), an enhanced small disk interface (ESDI), an Integrated Drive Electronics (IDE), a Mobile Industry Processor Interface MIPI), and a Nonvolatile Memory-express (NVM-e) and so on. Memory controller 110 communicates with nonvolatile memory device 120 through flash interface 119.

In the above embodiment, memory controller 110 reads data from nonvolatile memory device 120 and performs an error correct operation on the read data. Where a UECC error occurs, memory controller 110 performs the on-cell counting operation to adjust the level of the read voltage of nonvolatile memory device 120.

Figure 3:
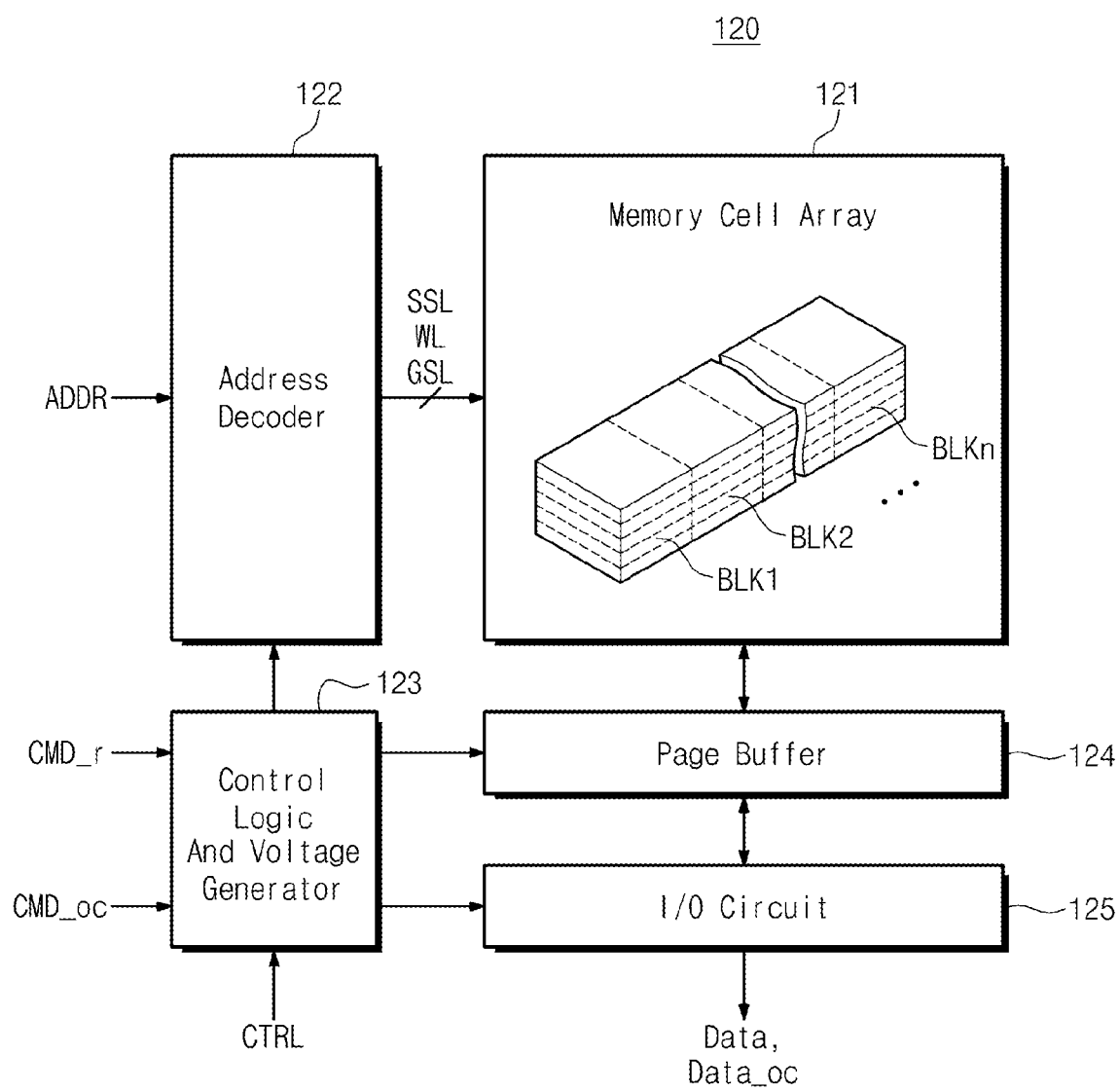
FIG. 3 is a block diagram of a nonvolatile memory device in FIG. 1 according to an embodiment of the inventive concept.

FIG. 3 is a block diagram of nonvolatile memory device 120 in FIG. 1.

Referring to FIGS. 1 and 3, nonvolatile memory device 120 comprises a memory cell array 121, an address decoder 122, a control logic & voltage generator block 123, a page buffer 124, and an input/output (I/O) circuit 125.

Memory cell array 121 comprises a plurality of memory blocks BLK1 to BLKn, and each of memory blocks BLK1 to BLKn comprises a plurality of strings. Each of the strings is connected to a bitline BL and comprises a plurality of memory cells. The memory cells are connected to a plurality of wordlines WL, respectively. Each of the memory cells may be provided as a multi-level cell (MLC) storing at least two bits or a single-level cell (SLC) storing 1-bit. In some embodiments, the memory blocks BLK1 to BLKn may have a three-dimensional structure where memory cells are stacked in a direction perpendicular to a substrate. In some embodiments, the memory cells may be provided as charge trap flash (CTF) memory cells.

Address decoder 122 is connected to the memory cell array 121 through a plurality of wordlines WL, string selection lines SSL, and ground selection lines GSL. Address decoder 122 is configured to receive an address ADDR and decode the received address ADDR. Address decoder 122 controls a voltage of wordlines WL based on the decoded address.

Control logic & voltage generator block 123 control the address decoder 122, page buffer 124, and I/O circuit 125. Control logic & voltage generator block 123 receives a read command CMD_r and controls address decoder 122, page buffer 124, and I/O circuit 125 to perform a read operation in response to the received read command CMD_r. Control logic & voltage generator block 123 receives an on-cell counting command CMD_oc and controls address decoder 122, page buffer 124, and I/O circuit 125 to perform an on-cell counting operation in response to the received on-cell counting command CMD_oc.

In some embodiments, the on-cell counting operation indicates an operation of only once reading memory cells connected to a wordline corresponding to the received address ADDR based on an on-cell counting voltage (or, a reference voltage). In some embodiments, nonvolatile memory device 120 may perform the on-cell counting operation to output on-cell data DATA_oc.

Control logic & voltage generator block 123 may generate a plurality of voltages. For example, it may generate a plurality of read voltages, a plurality of unselected read voltages, a plurality of program voltages, a plurality of pass voltages, a plurality of erase voltages, and so on. Control logic & voltage generator block 123 may adjust levels of a plurality of read voltages in response to the control signal CTRL.

Page buffer 124 is connected to memory cell array 121 through a plurality of bitlines BL. Page buffer 124 temporarily stores data to be written to the memory cell array 121 or data read from memory cell array 121.

I/O circuit 125 receives data from page buffer 124 during a read operation of nonvolatile memory device 120 and transmits the received data to memory controller 110. I/O circuit 125 receives on-cell data DATA_oc from page buffer 124 during the on-cell counting operation of nonvolatile memory device 120 and transmits the received on-cell data DATA_oc to memory controller 110.

Figure 4:
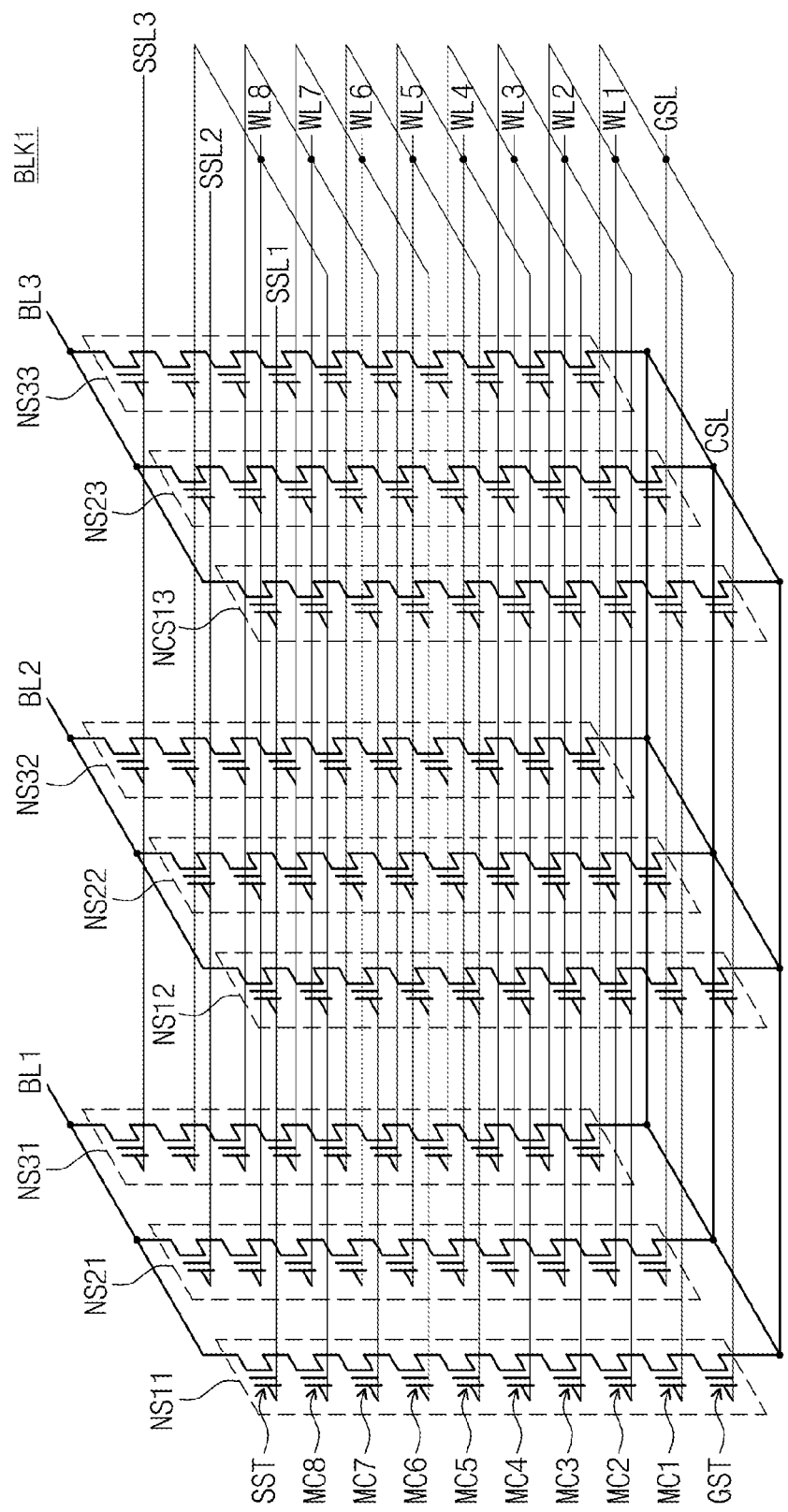
FIG. 4 is a circuit diagram of a first memory block among a plurality of memory blocks in FIG. 3 according to an embodiment of the inventive concept.

FIG. 4 is a circuit diagram of a first memory block among a plurality of memory blocks in FIG. 3.

Referring to FIG. 4, NAND strings NS11 to NS33 are coupled between bitlines BL1 to BL3 and a common source line CSL. Each NAND string (e.g., NS11) comprises a string selection transistor SST, a plurality of memory cells MC1 to MC8, and a ground selection transistor GST.

String selection transistor SST is connected to string selection lines SSL1 to SSL3. A plurality of memory cells MC1 to MC8 are connected to corresponding to wordlines WL1 to WL8, respectively. A ground selection transistor GST is connected to a ground selection line GSL. A string selection transistor SST is connected to a bitline BL, and a ground selection transistor GST is connected to a common source line CSL.

A wordline (e.g., WL1) of the same height is commonly connected, and string selection lines (e.g., SSL1 to SSL3) of the same height are separated. A first wordline WL1 and a first selection line SSL1 are selected when programming a memory cells that are connected to first wordline WL1 and are in NAND strings NS11, NS12, and NS13. Hereinafter, this memory cells will be referred to as "page".

Although not shown in the drawings, a memory block BLK1 may be disposed on a substrate (not shown) and a plurality of NAND strings NS11 to NS33 may be disposed in a direction perpendicular to the substrate. A string selection transistor SST, a plurality of memory cells MC1 to MC8, and a ground selection transistor GST in the NAND strings NS11 to NS3 may be stacked in the direction perpendicular to the substrate.

In some embodiments, a threshold voltages of the memory cells MC1 to MC8 may be determined by storing charges in charge storage layers (not shown) of memory cells, respectively. That is, charges are stored in the charge storage layer to determine a program state of the memory cells MC1 to MC8.

In some embodiments, after the memory cells are programmed, charges stored in a charge storage layer may be leaked to a channel as time elapses during a predetermined period. That is, after the memory cells MC1 to MC8 are programmed, a threshold voltage distribution may vary as a time elapses for a predetermined period. This phenomenon is called IVS.

Figure 5:
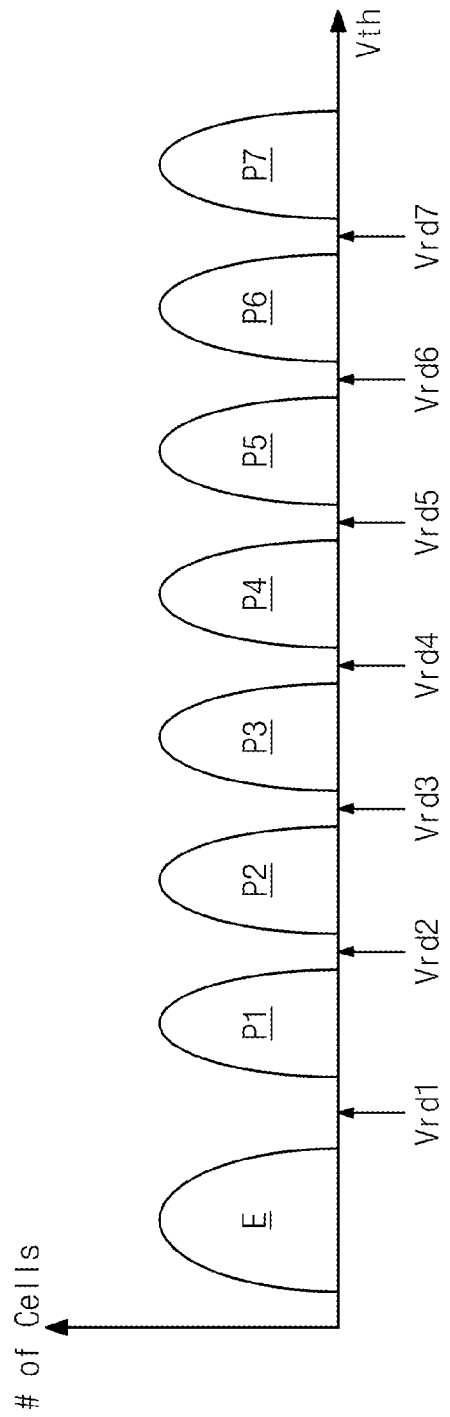
FIG. 5 is a scatter diagram showing a threshold voltage distribution of memory cells in FIG. 4 according to an embodiment of the inventive concept.

FIG. 5 is a scatter diagram showing a threshold voltage distribution of memory cells in FIG. 4. For convenience, it will be assumed that each of memory cells in nonvolatile memory device 120 is a triple-level cell (TLC) storing 3 bits of data. However, the scope of the inventive concept is not limited thereto.

Referring to FIGS. 3 and 5, a plurality of memory cells are programmed to have one of an erase state E and first to seventh program states P1 to P7.

Nonvolatile memory device 120 determines a program state of the programmed memory cells by using first to seventh read voltage Vrd1 to Vrd7. In some embodiments, first to seventh read voltages Vrd1 to Vrd7 are generated by the control logic & voltage generator block 123. Each of first to seventh read voltages Vrd1 to Vrd7 may have a predetermined voltage level to determine a program state of the programmed memory cells.

Figure 6:
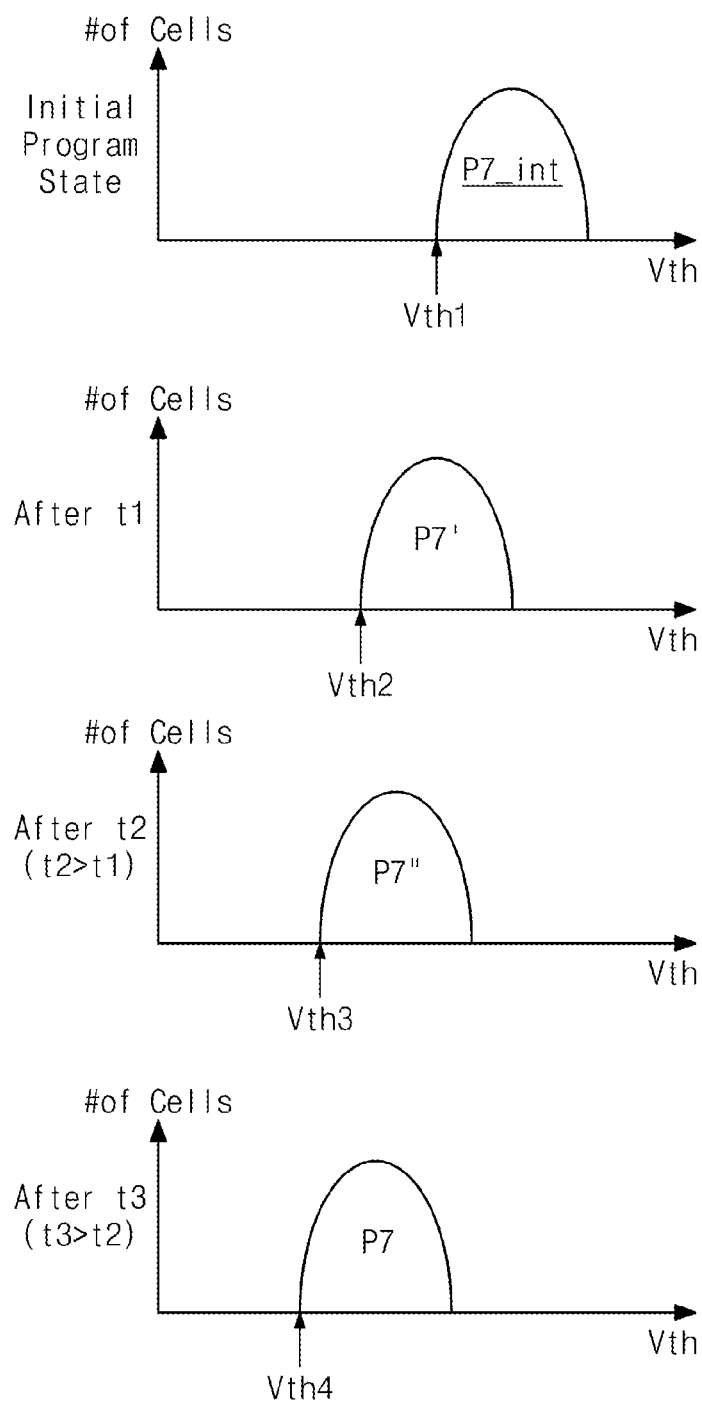
FIG. 6 shows scatter diagrams illustrating initial verify shift (IVS) of the memory cells in FIG. 4 according to an embodiment of the inventive concept.

FIG. 6 shows scatter diagrams illustrating IVS of the memory cells in FIG. 4. For convenience, the IVS will be described with reference to the seventh program state P7. However, the scope of the inventive concept is not limited thereto and IVS may occur with respect to each of a plurality of program states.

Referring to FIGS. 3 and 6, some of the memory cells may be programmed to seventh program state P7. In this case, nonvolatile memory device 120 may program memory cells to have an initial program state P7_int. After first time t1 elapses, a threshold voltage distribution of the memory cells having the initial program state P7_int may vary like a threshold voltage distribution of a program state P7'. That is, a threshold voltage of memory cells may decrease with the lapse of time after the memory cells are programmed. As charges trapped to a charge storage layer of a memory cell are leaked to a channel layer with the lapse of time, a threshold voltage of the memory cell may decrease.

After second time t2 (t2>t1) elapses, the threshold voltage distribution of the memory cell may be identical to a program state P7". After third time t3 (t3>t2) elapses, the threshold voltage distribution of the memory cells may be stabilized to be identical to seventh program state P7.

In some embodiments, a lower limit Vth4 of the threshold voltage distribution of seventh program state P7 is smaller than a lower limit Vth3 of a threshold voltage distribution of the program state P7". A lower limit Vth2 of a threshold voltage distribution of program state P7' is smaller than a lower limit Vth1 of a threshold voltage distribution of initial program state P7_int.

As described above, due to physical characteristics of memory cells (esp., CTF memory cells), a threshold voltage of the memory cells may decrease with the lapse of time after the memory cells are programmed. In other words, IVS may occur.

Figure 7:
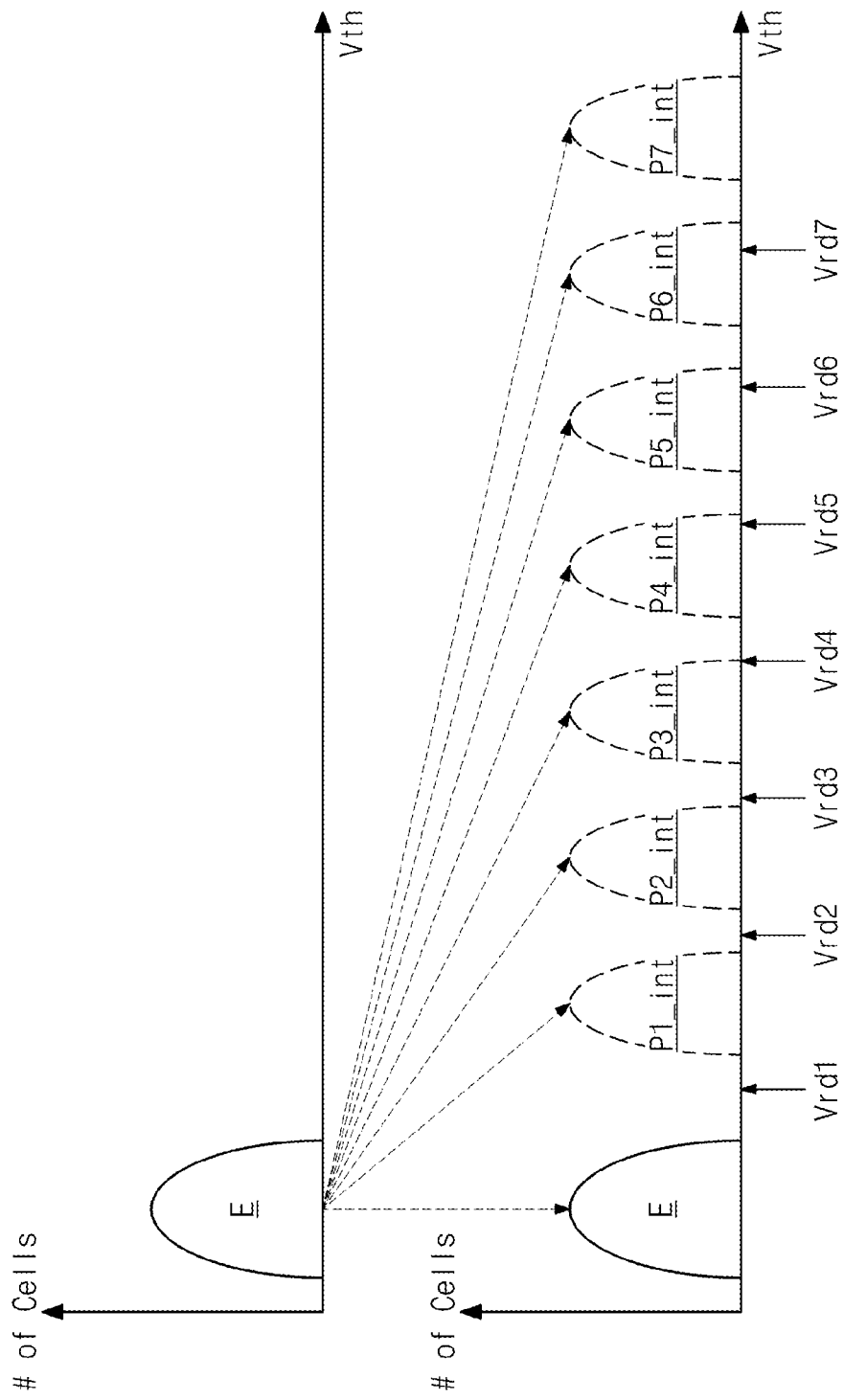
FIG. 7 is a scatter diagram illustrating an error caused by IVS.

FIG. 7 is a scatter diagram illustrating an error caused by IVS.

Referring to FIG. 3 and FIGS. 5 to 7, nonvolatile memory device 120 may program a plurality of memory cells to have one of an erase state E and first to seventh initial program states Mint to P7_int. In some embodiments, the first to seventh initial program states Mint to P7_int may have a higher threshold voltage than stabilized program states (i.e., P1 to P7) in consideration of IVS.

That is, nonvolatile memory device 120 may program memory cells to be programmed to the first to seventh program states P1 to P7 to the first to seventh initial program states Mint to P7_int such that the memory cells have a higher threshold voltage than a threshold voltage of the first to seventh program states P1 to P7, respectively. For example, nonvolatile memory device 120 may perform a program operation based on high-speed programming (HSP) such that memory cells of an erase state E may have one of the first to seventh program states Mint to P7_int.

In some embodiments, a program scheme of nonvolatile memory device 120 is not limited to high-speed programming and may employ various program schemes such as shadow programming, pseudo programming, one-shot programming, and reprogramming.

Immediately after memory cells of nonvolatile memory device 120 are programmed, a read command CMD_r for the programmed memory cells may be received. In this case, nonvolatile memory device 120 may determine a program state of the memory cells based on first to seventh read voltage Vrd1 to Vrd7.

In some embodiments, a plurality of read voltages of nonvolatile memory device 120 are determined based on a stabilized threshold voltage distribution (i.e., threshold voltage distribution after predetermined time elapses). That is, where the memory cells of nonvolatile memory device 120 are read immediately after they are programmed, nonvolatile memory device 120 may read error-containing data, as illustrated in FIG. 7. An error contained in the data may be an error exceeding the error correctable range of ECC engine 111 (see FIG. 2). That is, as described above, an error caused by IVS may be an uncorrectable error correction code (UECC) error.

Figure 8:
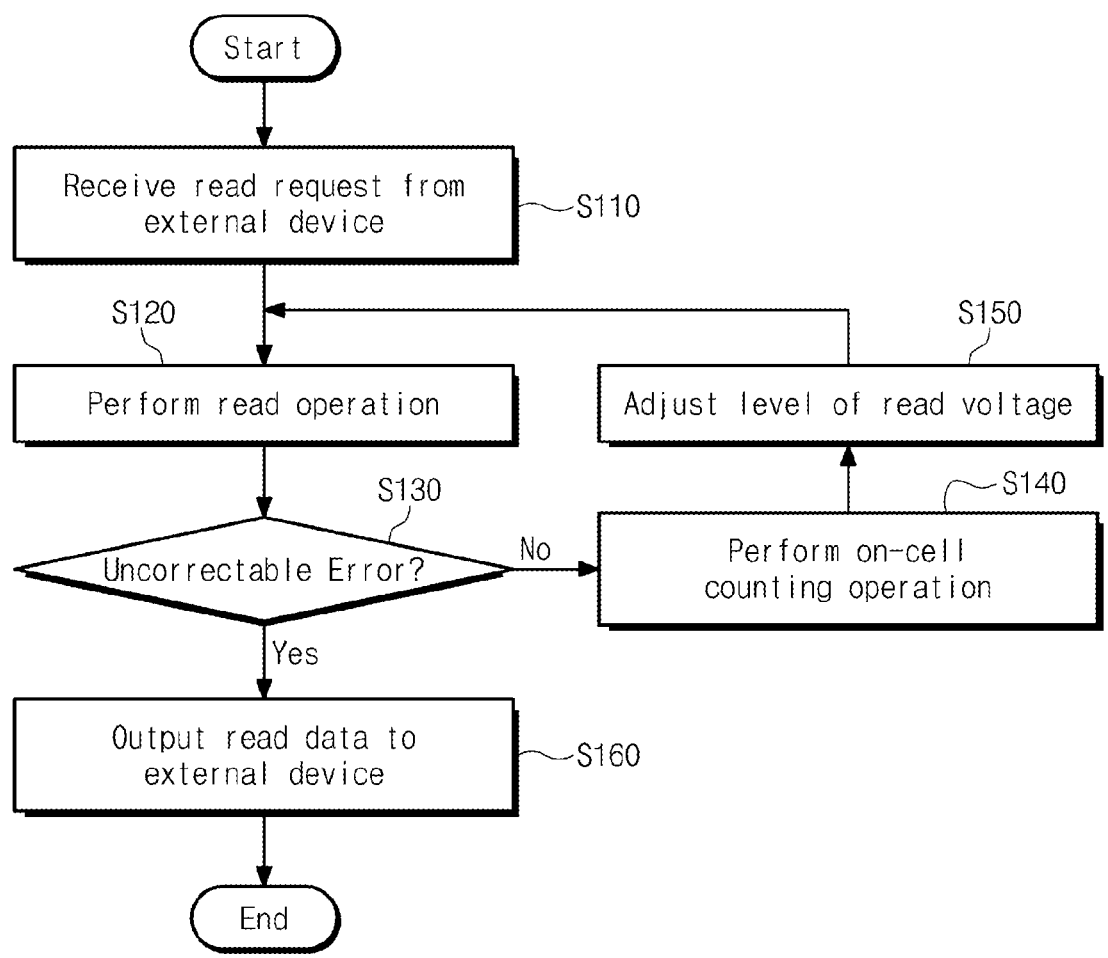
FIG. 8 is a flowchart illustrating the operation of the nonvolatile memory system in FIG. 1 according to an embodiment of the inventive concept.

FIG. 8 is a flowchart illustrating the operation of the nonvolatile memory system in FIG. 1.

Referring to FIGS. 1 and 8, in a step S110, nonvolatile memory system 100 receives a read request from an external device (e.g., a host, an application processor and etc.). In a step S120, nonvolatile memory system 100 performs a read operation. For example, memory controller 110 may transmit an address ADDR and a read command CMD_r to nonvolatile memory device 120 in response to the received read request. Nonvolatile memory device 120 may read data stored in memory cells corresponding to address ADDR in response to read command CMD_r and may transmit the read data to memory controller 110.

In a step S130, nonvolatile memory system 100 determines whether a UECC error is contained in the read data. For example, memory controller 110 may perform an error correct operation on the received data. Memory controller 110 may detect an error contained in the data based on the error correct operation and may correct the detected error. When the error contained in the data exceeds error correctable capacity, memory controller 110 determines that the UECC error is contained in the data. In some embodiments, the error correction operation may be performed by ECC engine 111 (see FIG. 2).

In a step S140, nonvolatile memory system 100 may perform an on-cell counting operation, when the UECC error is contained in the data. For example, when the UECC error is contained in the data, memory controller 110 may transmit address ADDR and an on-cell counting command CMD_oc to nonvolatile memory device 120. Nonvolatile memory device 120 may read memory cells corresponding to address ADDR in response to on-cell counting command CMD_oc and transmit on-cell data DATA_oc to the memory controller 110. In some embodiments, the on-cell counting operation indicates an operation of only once reading memory cells based on a reference voltage.

In a step S150, nonvolatile memory system 100 adjusts a level of a read voltage. For example, memory controller 110 may detect the number of on-cells based on on-cell data DATA_oc. Memory controller 110 may select a desired read voltage based on the detected number of on-cells and C to V LUT 113. Memory controller 110 may transmit a control signal CTRL such that the nonvolatile memory device operates based on the selected optical read voltage. Nonvolatile memory device 120 may reset levels of a plurality of read voltage in response to the control signal CTRL.

Thereafter, nonvolatile memory system 100 returns to S120. At this time, nonvolatile memory system 100 performs a read operation based on the reset read voltages. Where the UECC error is not contained in the data, nonvolatile memory system 100 may output the read data to an external device.

In some embodiments, nonvolatile memory system 100 performs the on-cell counting operation to adjust a read voltage while omitting the steps of S120 and S130. That is, nonvolatile memory system 100 may adjust the read voltage based on the on-cell counting operation at starting a read operation.

Figure 9:
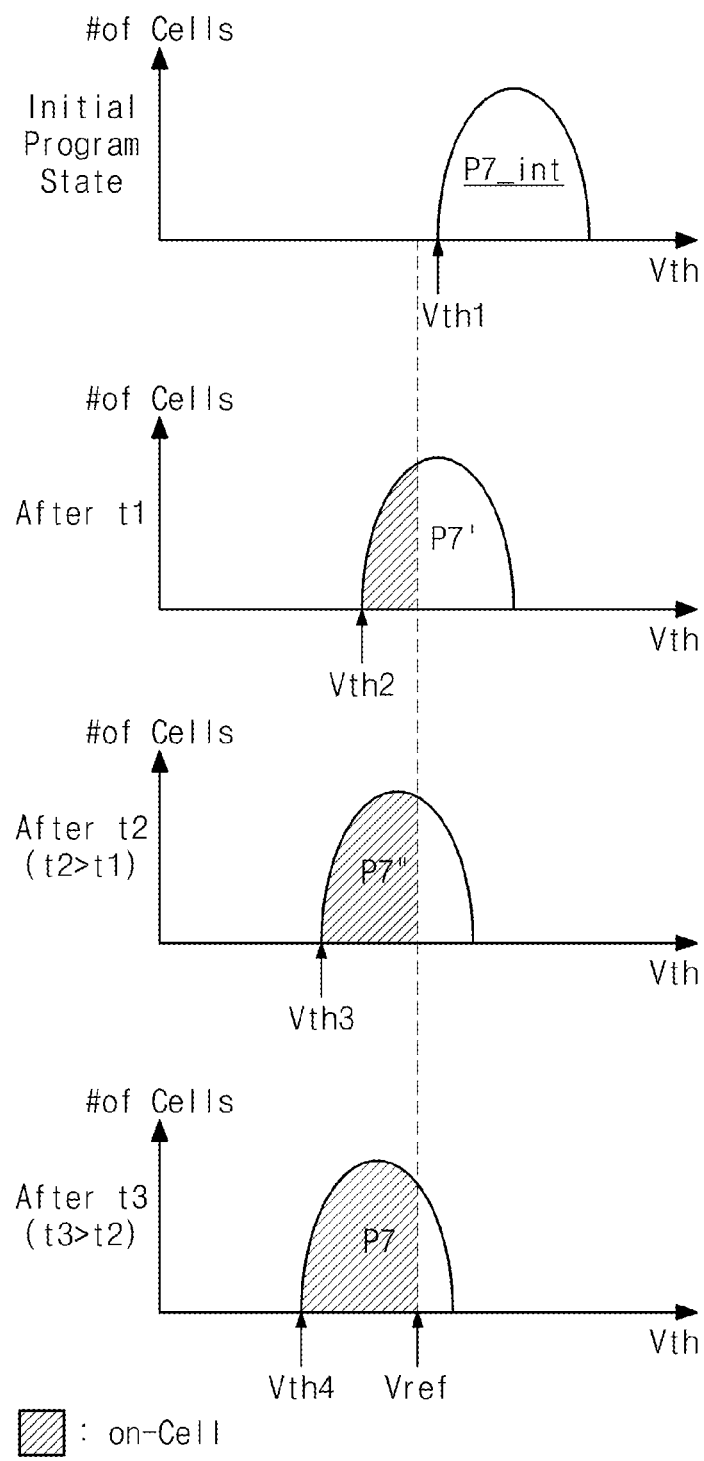
FIG. 9 shows scatter diagrams for an operation in the method of FIG. 8.

FIG. 9 shows scatter diagrams illustrating S140 in FIG. 8. For brevity of description, an initial program state P7_int, program states P7' and P7", and a seventh program state P7 were explained with reference to FIG. 6 and will not explained in further detail.

Referring to FIGS. 1, 8, and 9, nonvolatile memory system 100 may perform an on-cell counting operation. For example, when a UECC error is detected, memory controller 110 may transmit an on-cell counting command CMD_oc to nonvolatile memory device 120. Nonvolatile memory device 120 may perform a read operation only once based on a reference voltage Vref to generate on-cell data DATA_oc. Nonvolatile memory device 120 may transmit on-cell data DATA_oc to memory controller 110.

As described with reference to FIG. 6, a threshold voltage distribution of memory cells in nonvolatile memory device 120 may be changed by IVS after the memory cells are programmed. That is, where the memory cells in nonvolatile memory device 120 are read with a reference voltage Vref, the number of turned-on memory cells may vary depending on elapsed program time.

In some embodiments, memory cells connected to a single wordline may have program states of the same rate by a randomizing operation of a randomizer 116 (see FIG. 2). For example, memory cells may be subjected to high-speed programming (HSP) to have one of an erase state E and first to seventh program states P1 to P7. if the number of the memory cells connected to the single wordline is 128, the number of memory cells, having the erase state E, among memory cells of a page in which randomized data is stored may be 16 (i.e., 128/8). Among the memory cells of the page in which randomized data is stored, the number of memory cells, respectively, having the first to seventh program states P1 to P7 may also be 16. That is, at the single wordline, the number of the memory cells having the erase state E and the number of the memory cells respectively having the first to seventh program states P1 to P7 may be equal to each other.

That is, where the memory cells in nonvolatile memory device 120 are read on the basis of the reference voltage Vref, the number of turned-on memory cells may vary depending on elapsed program time. In some embodiments, the number of the on-cells may increase as time elapses. Memory controller 110 may detect the elapsed program time based on the number of on-cells.

In some embodiments, reference voltage Vref is lower than a lower limit Vth1 of the threshold voltage distribution range of the initial program state P7_int and higher than a lower limit Vth4 of the threshold voltage distribution range of the seventh program state P7 (i.e., stabilized program state). Although not shown in the figures, reference voltage Vref may be set to be within the threshold voltage distribution range of the first to seventh program states P1 to P7.

Figure 10:
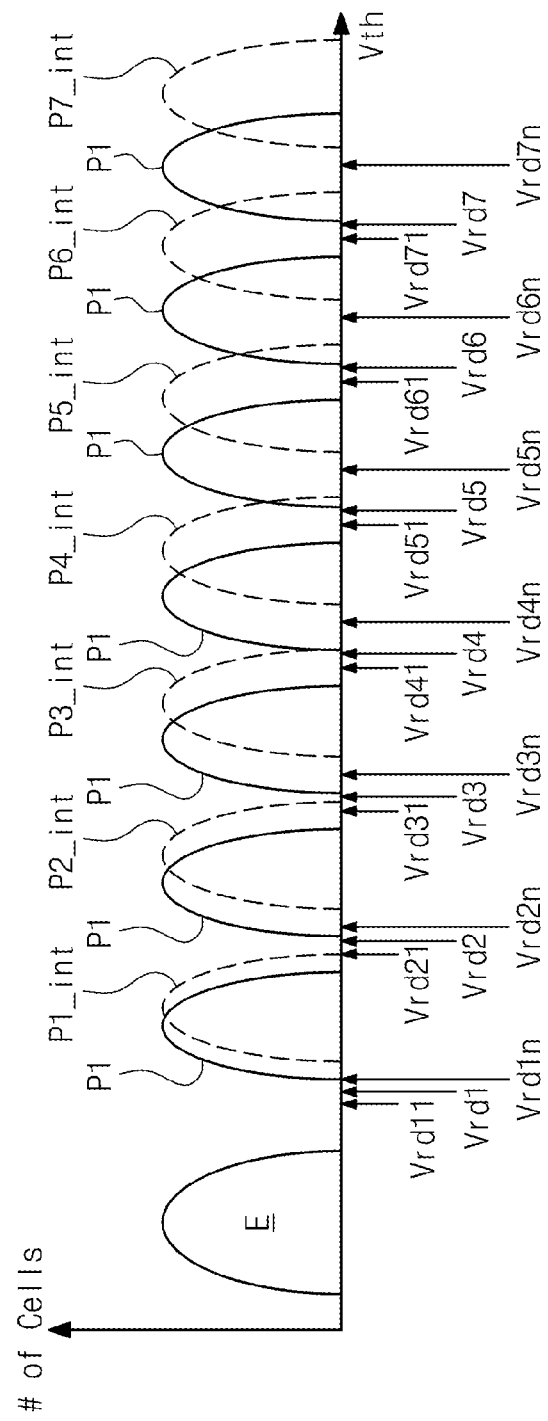
FIG. 10 illustrates an operation in the method of FIG. 8, according to an embodiment of the inventive concept.
Figures 11, 12:
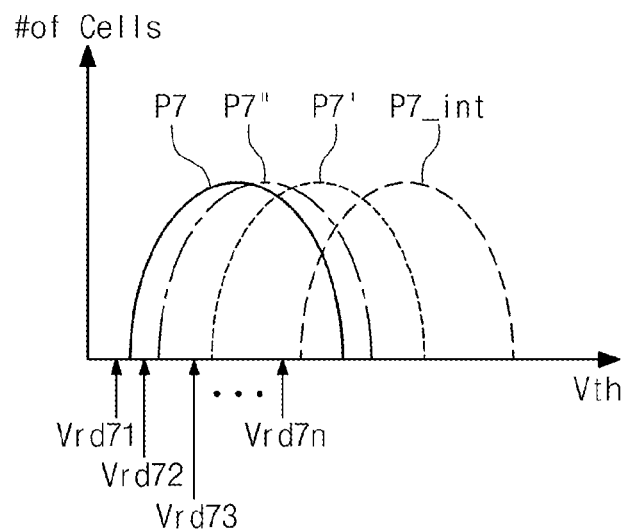
FIG. 11 illustrates an operation in the method of FIG. 8, according to an embodiment of the inventive concept.
FIG. 12 illustrates an operation in the method of FIG. 8, according to an embodiment of the inventive concept.

FIGS. 10 to 12 illustrate S150 in FIG. 8 in further detail.

Referring to FIGS. 1, 8, and 10, nonvolatile memory system 100 adjusts a level of a read voltage of nonvolatile memory device 120 based on on-cell data DATA_on. For example, memory controller 110 may detect the number of on-cells based on on-cell data DATA_oc. Memory controller 110 may determine a desired level of the read voltage of nonvolatile memory device 120 based on the detected number of on-cells and a C to V LUT 113. For example, memory controller 110 may determine levels of first to seventh read voltages Vrd1 to Vrd7, as shown in FIG. 10.

First read voltage Vrd1 may be between a voltage Vrd11 and a voltage Vrd1$n$. Voltage Vrd11 may be higher than an upper limit of the threshold voltage distribution range of erase state E and lower than a lower limit of the threshold voltage distribution range of first program state (i.e., stabilized first program state) P1. Voltage Vrd1$n$ may be higher than voltage Vrd11 and lower than a lower limit of the threshold voltage distribution range of first initial program state P1_int.

Second read voltage Vrd2 may be between a voltage Vrd21 and a voltage Vrd2n. Voltage Vrd21 is higher than an upper limit of the threshold voltage distribution range of first program state P1 and lower than a lower limit of the threshold voltage distribution range of second program state P2. Voltage Vrd2n is higher than voltage Vrd21 and lower than a lower limit of the threshold voltage distribution range of second initial program state P2_int.

The third read voltage Vrd3 may be between a voltage Vrd31 and a voltage Vrd3n. Voltage Vrd31 is higher than an upper limit of the threshold voltage distribution range of second program state P2 and lower than a lower limit of the threshold voltage distribution range of third program state P3. Voltage Vrd3n is higher than voltage Vrd31 and lower than a lower limit of the threshold voltage distribution range of third initial program state P3_int.

Fourth read voltage Vrd4 may be between a voltage Vrd41 and a voltage Vrd4n. Voltage Vrd41 is higher than an upper limit of the threshold voltage distribution range of third program state P3 and lower than a lower limit of the threshold voltage distribution range of fourth program state P4. Voltage Vrd4n is higher than voltage Vrd41 and lower than a lower limit of the threshold voltage distribution range of fourth initial program state P4_int.

Fifth read voltage Vrd5 may be between a voltage Vrd51 and a voltage Vrd5n. The voltage Vrd51 is higher than an upper limit of the threshold voltage distribution range of fourth program state P4 and lower than a lower limit of the threshold voltage distribution range of fifth program state P5. Voltage Vrd5n is higher than voltage Vrd51 and lower than a lower limit of the threshold voltage distribution range of fifth initial program state P5_int.

Sixth read voltage Vrd6 may be between a voltage Vrd61 and a voltage Vrd6n. Voltage Vrd61 is higher than an upper limit of the threshold voltage distribution range of fifth program state P5 and lower than a lower limit of the threshold voltage distribution range of sixth program state P6. Voltage Vrd6n is higher than voltage Vrd61 and lower than a lower limit of the threshold voltage distribution range of sixth initial program state P6_int.

Seventh read voltage Vrd7 may be between a voltage Vrd71 and a voltage Vrd7n. The voltage Vrd71 is higher than an upper limit of the threshold voltage distribution range of the sixth program state P6 and lower than a lower limit of the threshold voltage distribution range of seventh program state P7. Voltage Vrd7n is higher than voltage Vrd71 and lower than a lower limit of the threshold voltage distribution range of the seventh initial program state P7_int.

An example voltage level of seventh read voltage Vrd7 will be described in detail with reference to FIG. 11. However, the scope of the inventive concept is not limited thereto and first to sixth read voltages Vrd1 to Vrd6 may also be set based on the method described with reference to FIG. 11.

Referring to FIG. 11, seventh read voltage Vrd7 may be set to one of a plurality of voltage Vrd71 to Vrd7n. For example, a threshold voltage distribution of memory cells in nonvolatile memory device 120 may vary depending on elapsed program time, as described with reference to FIG. 6.

Memory controller 110 may set the seventh voltage Vrd7 to one of the voltages Vrd71 to Vrd7n, based on the number of on-cells and C to V LUT 113. In some embodiments, voltage Vrd71 may be a read voltage to determine the seventh program state (i.e., stabilized program state) P7.

Voltage Vrd7n may be a read voltage to determine seventh initial program state P7_int. That is, memory controller 110 may determine a desired read voltage level for a varied threshold voltage distribution based on the number of on-cells.

Referring to FIG. 12, memory controller 110 comprises C to V LUT 113. C to V LUT 113 comprises information into which a relationship between then number of on-cells and the read voltage is mapped.

In some embodiments, the number of on-cells may be set to a plurality of periods. The periods are mapped with information of predetermined read voltages, respectively. For example, when the number of on-cells is in a first period, memory controller 110 may adjust a read voltage of nonvolatile memory device 120 such that nonvolatile memory device 120 operates based on read voltages Vrd11 to Vrd71.

In the above embodiment, where a UECC error is detected in data, nonvolatile memory system 100 performs an on-cell counting operation to generate on-cell data DATA_oc. Nonvolatile memory system 100 detects a desired read voltages of nonvolatile memory device 120 based on on-cell data DATA_oc and controls nonvolatile memory device 120 such that nonvolatile memory device 120 operates based on the detected desired read voltages. Thus, because a UECC error caused by IVS may decrease and storage of program time is not required, storage space is saved. As a result, a nonvolatile memory system with improved reliability and improved performance is provided.

Figure 13:
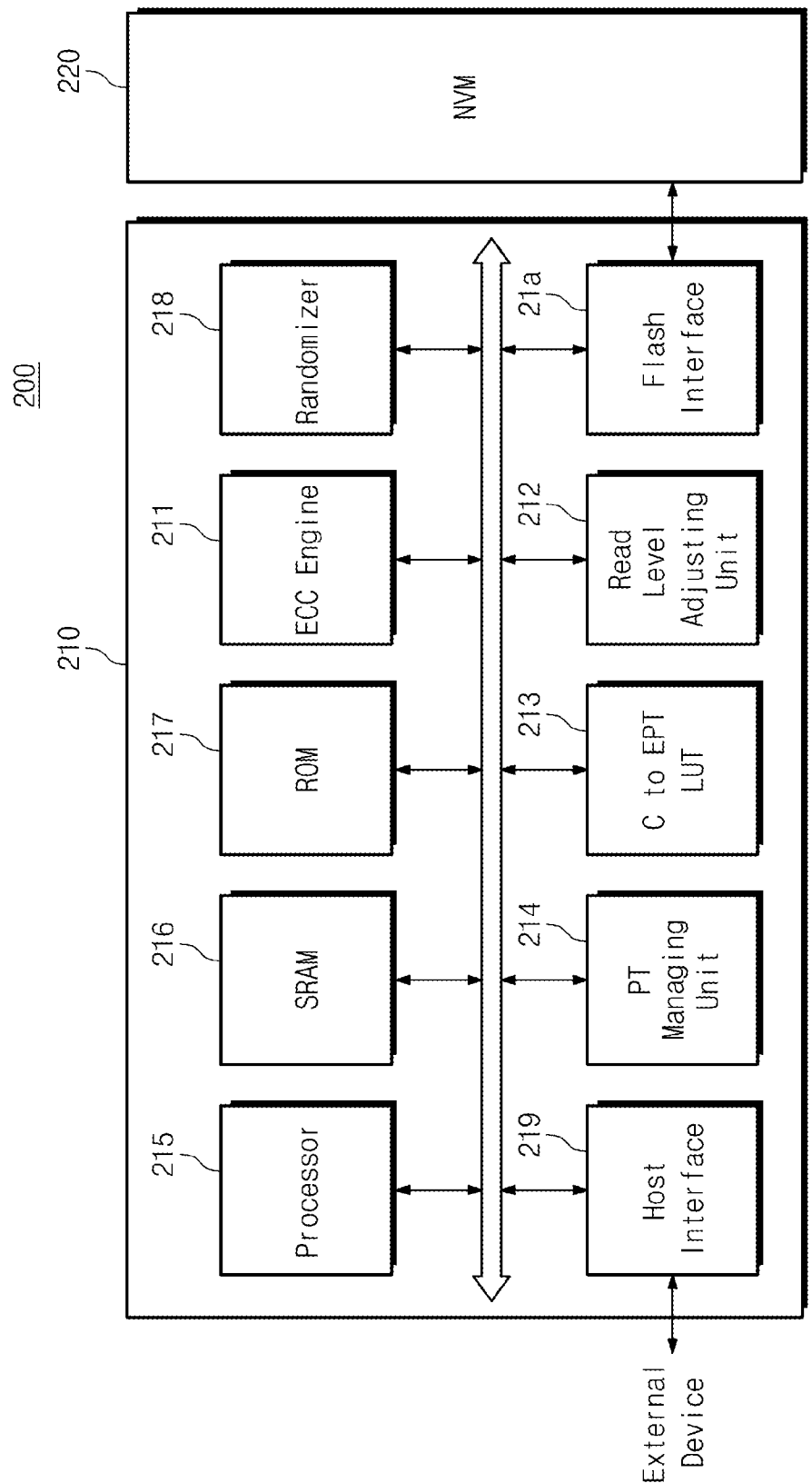
FIG. 13 is a block diagram of a nonvolatile memory system according to another embodiment of the inventive concept.

FIG. 13 is a block diagram of a nonvolatile memory system 200 according to another embodiment of the inventive concept.

Referring to FIG. 13, nonvolatile memory system 200 comprises a memory controller 210 and a nonvolatile memory device 220. Memory controller 210 comprises an ECC engine 211, a read level adjusting unit 212, an on-cell and elapsed program time look-up table (C to EPT LUT) 213, a program time (PT) managing unit 214, a processor 215, an SRAM 216, a ROM 217, a randomizer 218, a host interface 219, and a flash interface 21a.

Nonvolatile memory device 220, ECC engine 211, read level adjusting unit 212, processor 215, SRAM 216, ROM 217, randomizer 218, host interface 219, and flash interface 21a were explained with reference to FIG. 2 and will not be explained in further detail.

Read level adjusting unit 212 detects elapsed program time (EPT) based on the number of on-cells and C to EPT LUT 213. Read level adjusting unit 212 adjusts a read voltage of nonvolatile memory device 120 based on the detected EPT. For example, where the EPT is shorter than predetermined time, the read level adjusting unit 212 may increase the read voltage of nonvolatile memory device 120 by a predetermined level.

In some embodiments, read level adjusting unit 212 manages the EPT with a plurality of periods and manage voltage levels for the periods to be different from each other. In some embodiments, the EPT indicates time elapsed from a point of time when data is programmed. In some embodiments, PT may be calculated based on the EPT. The PT is a point of time when data is programmed.

C to EPT LUT 213 comprises information on a relationship between the number of on-cells and elapsed program time. In some embodiments, C to EPT LUT 213 may be predetermined information based on a program/erase cycle count, a position of a memory block, a wordline number, and the like. C to EPT LUT 213 may be stored in the SRAM 216 or the ROM 217 in the form of firmware. The processor 215 may manage or update C to EPT LUT 213 stored in the SRAM 216.

Program time managing unit 214 manages PT. For example, program time managing unit 214 may calculate PT based on the detected erased program time (EPT). Program time managing unit 214 may manage information of the PT for each of a plurality of memory blocks.

In some embodiments, program time managing unit 214 may mange PT in units of memory blocks. Alternatively, program time managing unit 214 may manage PT in units of wordlines. Alternatively, program time managing unit 214 may manage the record of an adjusted read voltage in units of memory blocks.

Alternatively, program time managing unit 214 may manage the record of an adjusted read voltage in units of wordlines. In some embodiments, the record of an adjusted read voltage indicates whether a read voltage is adjusted when data stored in a corresponding memory block or a corresponding wordline is read.

Alternatively, program time managing unit 214 may manage PT in units of write buffers. In some embodiments, the unit of a write buffer may be a storage unit of a page buffer 124 (see FIG. 3) of nonvolatile memory device 120. In some embodiments, program time managing unit 214 may be stored in the SRAM 216 and driven or updated by processor 215.

Figure 14:
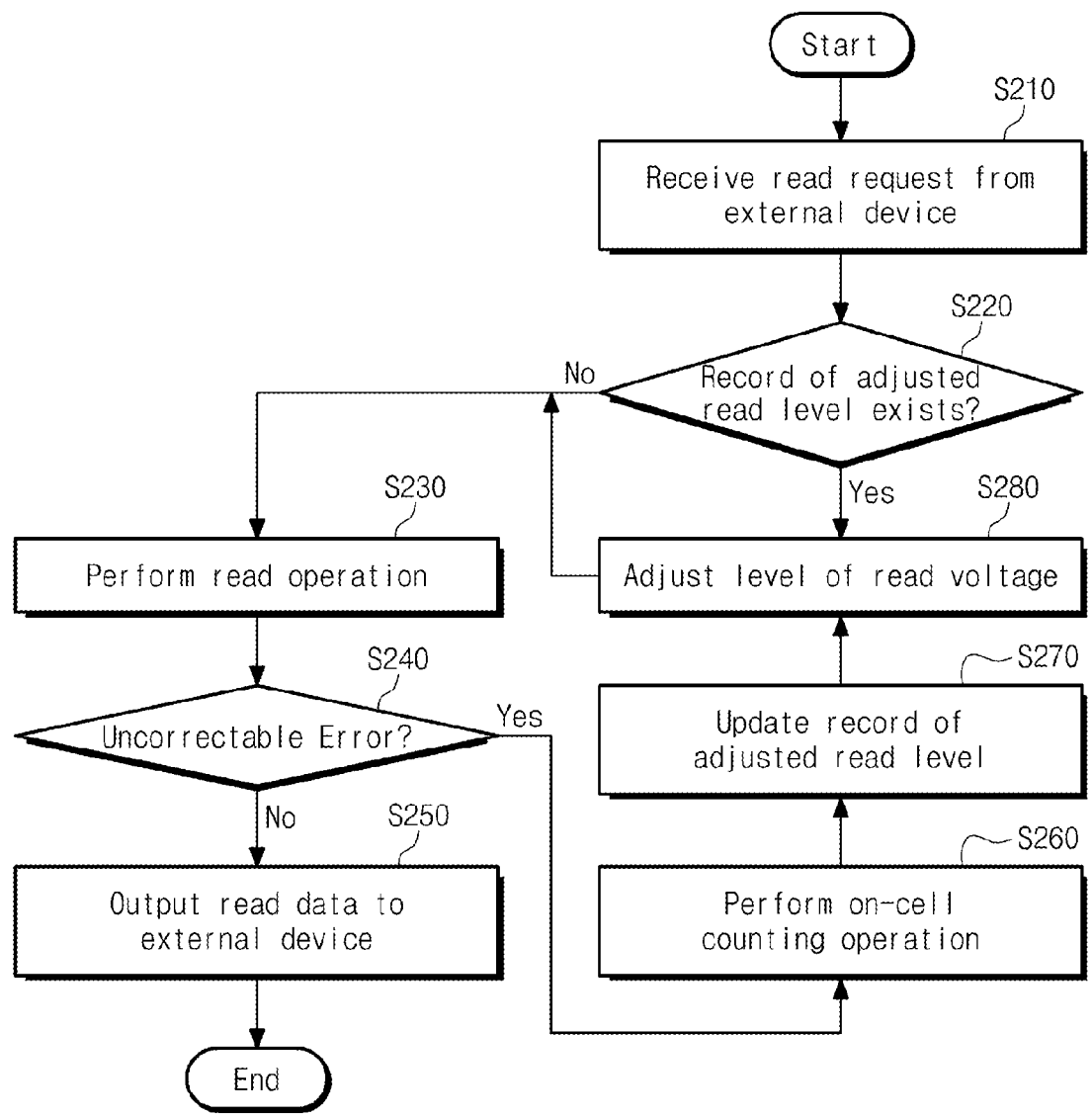
FIG. 14 is a flowchart illustrating the operation of the nonvolatile memory system in FIG. 13 according to an embodiment of the inventive concept.

FIG. 14 is a flowchart illustrating the operation of nonvolatile memory system 200 in FIG. 13.

Referring to FIGS. 13 and 14, in a step S210, nonvolatile memory system 200 may receives a read request from an external device.

In a step S220, nonvolatile memory system 200 determines whether there is a record of adjusted read voltages. For example, program time managing unit 214 may manage the record of the adjusted read voltages in units of memory blocks. That is, program time managing unit 214 may assign a one-bit logical value per memory block to manage whether read voltages are adjusted. With reference to program time managing unit 214, a memory controller may determine whether the read voltages of a memory block to be subjected to a read operation is adjusted.

Where the read voltages are not adjusted, in a step S230, nonvolatile memory system 200 performs a read operation. In a step S240, nonvolatile memory system 200 determines whether a UECC error is contained in read data DATA.

Where the UECC error is not contained in the data, nonvolatile memory system 200 outputs the data to the external device. Where the UECC error is contained in data DATA, in a step S260, nonvolatile memory system 200 performs an on-cell counting operation.

In a step S270, nonvolatile memory system 200 updates the record of the adjusted read voltages. For example, nonvolatile memory system 200 may detect the number of on-cells based on the on-cell counting operation. Nonvolatile memory system 200 may detect EPT based on the detected number of on-cells and the on-cell and program time look-up table 213. Nonvolatile memory system 200 may update the record of the adjusted read voltages for the memory block subjected to the read operation.

In a step S280, nonvolatile memory system 200 may adjust a level of the read voltages. For example, the nonvolatile memory system 280 may select a desired read voltages based on the detected EPT and may adjust read voltages such that the nonvolatile memory device 200 operates based on the selected desired read voltages, as described with reference to FIGS. 10 and 11. In some embodiments, the shorter the detected EPT is, the more nonvolatile memory system 200 may increase levels of a plurality of read voltages.

Then, nonvolatile memory system 200 performs step S230. At this point, nonvolatile memory system 200 may perform a read operation based on the adjusted read voltage. Where a result of the determination in step S230 indicates that there is no record of the adjusted read voltage, nonvolatile memory system 200 may perform step S280.

In the above embodiment, nonvolatile memory system 200 manages whether a read voltage is adjusted. Thus, nonvolatile memory system 200 may adjust a read voltage in advance when reading memory blocks with the adjusted read voltage once more. As a result, a nonvolatile memory system with improved reliability and improved performance is provided.

FIG. 15 illustrates C to EPT LUT 213 in FIG. 13.

Referring to FIGS. 13 and 15, C to EPT LUT 213 comprises information on the number of on-cells and EPT. The number of on-cells may be divided into a plurality of periods (first to nth periods). Elapsed program times EPT1 to EPTn may be determined with respect to the first to nth periods, respectively. For example, when the number of on-cells is in the first period, the read level adjusting unit 212 may determine elapsed program time of a memory block storing on-cell data DATA_oc as first elapsed program time EPT1 based on an on-cell and elapsed program time look-up table.

Program time managing unit 214 manages PT of a memory block storing on-cell data DATA_oc (i.e., selected memory block) based on the determined first elapsed program time EPT1. Although not shown in the drawings, read level adjusting unit 212 adjusts a read voltage of nonvolatile memory device 200 based on the PT stored in program time managing unit 214. That is, after an on-cell counting operation is performed only once on a single memory block, the read voltage of nonvolatile memory device 220 may be adjusted based on the PT managed by program time managing unit 214 without performing an additional on-cell counting operation.

In the above embodiment, a nonvolatile memory system performs an on-cell counting operation to detect PT and may manage the detected PT in units of memory blocks, sub-blocks, write buffers or wordlines. However, because the nonvolatile memory system may detect the PT based on the on-cell counting operation even when information on the PT is lost, a separate backup or flush operation is not required. As a result, a nonvolatile memory system with improved reliability and improved performance is provided.

FIGS. 16 and 17 illustrate program time managing unit 214 in FIG. 13.

Referring to FIGS. 13 and 16, program time managing unit 214 manages the record of an adjusted read voltage with respect to each of a plurality of memory blocks BLK1 to BLKn. For example, when a read voltage is not adjusted during a read operation on the first memory block BLK1, program time managing unit 214 may manage a logical value corresponding to first memory block BLK1 as "0". Where the read voltage is adjusted during a read operation on second and third memory blocks BLK2 and BLK3, program time managing unit 214 may manage logical values corresponding to second and third memory blocks BLK2 and BLK3 as "1". Thereafter, during the read operation on the second and third memory blocks BLK2 and BLK3, nonvolatile memory system 200 may adjust a level of the read voltage prior to the read operation.

Referring to FIGS. 13 and 17, program time managing unit 214 manage PT for each of a plurality of wordlines. For example, a second memory block BLK2 may be a memory block with an adjusted read voltage. In this case, program time managing unit 214 may manage program times PT1 to PTm (e.g., program time based on elapsed program time detected in accordance to the method described with reference to FIG. 13) with respect to a plurality of wordlines WL1 to WLm. Alternatively, program time managing unit 214 may manage program times of some of the wordlines WL1 to WLm.

Although a method of managing the record of an adjusted read voltage in units of memory blocks and a method of managing program time in units of wordlines have been described with reference to FIGS. 16 and 17, the inventive concept is not limited thereto. Program time managing unit 214 may manage PT in units of memory blocks. Alternatively, program time managing unit 214 may manage the record of an adjusted read voltage in units of wordlines. Alternatively, program time managing unit 214 may manage PT in units of write buffers.

In the above embodiment, nonvolatile memory system 200 performs an on-cell counting operation to detect EPT. Nonvolatile memory system 200 may set an optical read voltage based on the detected EPT. Thus, because a separate storage area (i.e., nonvolatile memory area) to store program time is not required, capacity utilization of the nonvolatile memory device 220 increases. Moreover, nonvolatile memory system 200 may perform an on-cell counting operation to detect PT even when program time information is lost during sudden power-off. Thus, the nonvolatile memory system with improved reliability is provided.

Figure 18:
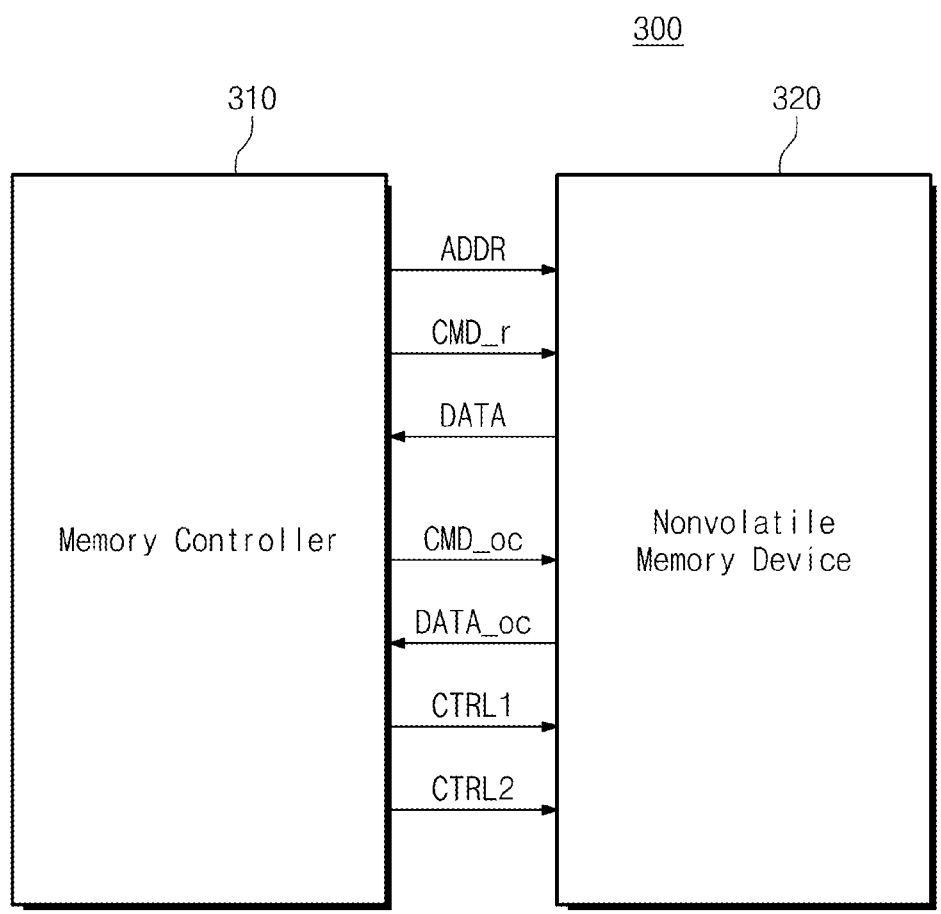
FIG. 18 is a block diagram of a nonvolatile memory system according to another embodiment of the inventive concept.

FIG. 18 is a block diagram of a nonvolatile memory system 300 according to another embodiment of the inventive concept.

Referring to FIG. 18, nonvolatile memory system 300 comprises a memory controller 310 and a nonvolatile memory device 320. Memory controller 310 and nonvolatile memory device 320 were explained with reference to FIG. 1 and will not be explained in further detail.

In contrast to the memory controller shown in FIG. 1, memory controller 310 shown in FIG. 17 transmits first and second control signals CTRL1 and CTRL2 to memory device 320s. First control signal CTRL1 may be a signal to adjust a read voltage of the nonvolatile memory device 320, and second control signal CTRL2 may be a signal to recover the adjusted read voltage (i.e., to convert the adjusted read voltage into a read voltage corresponding to a stabilized program state).

When a UECC error is detected, memory controller 310 may perform an on-cell counting operation to adjust a read voltage of nonvolatile memory device 320. Memory controller 310 may transmit first control signal CTRL1 to adjust the read voltage of nonvolatile memory device 320. Nonvolatile memory device 320 adjusts the read voltage in response to first control signal CTRL1.

Then, after nonvolatile memory device 3000 completes the read operation based on the adjusted read voltage, memory controller 310 transmits second control signal CTRL2 to nonvolatile memory device 320 to recover the adjusted read voltage (i.e., to convert the adjusted read voltage into a read voltage corresponding to a stabilized program state). Nonvolatile memory device 320 recovers the adjusted read voltage to an original state in response to second control signal CTRL2.

In some embodiments, memory controller 310 recovers the adjusted read voltage after the read operation is completed (i.e., after data DATA is output to an external device). Alternatively, memory controller 310 may recover the adjusted read voltage after predetermined time elapses.

In the above embodiment, nonvolatile memory system 300 performs an on-cell counting operation to adjust a read voltage when a UEC error is generated by IVS. Then, nonvolatile memory system 300 recovers the adjusted read voltage to an original state. As a result, a nonvolatile memory system with improved reliability is provided.

Figure 19:
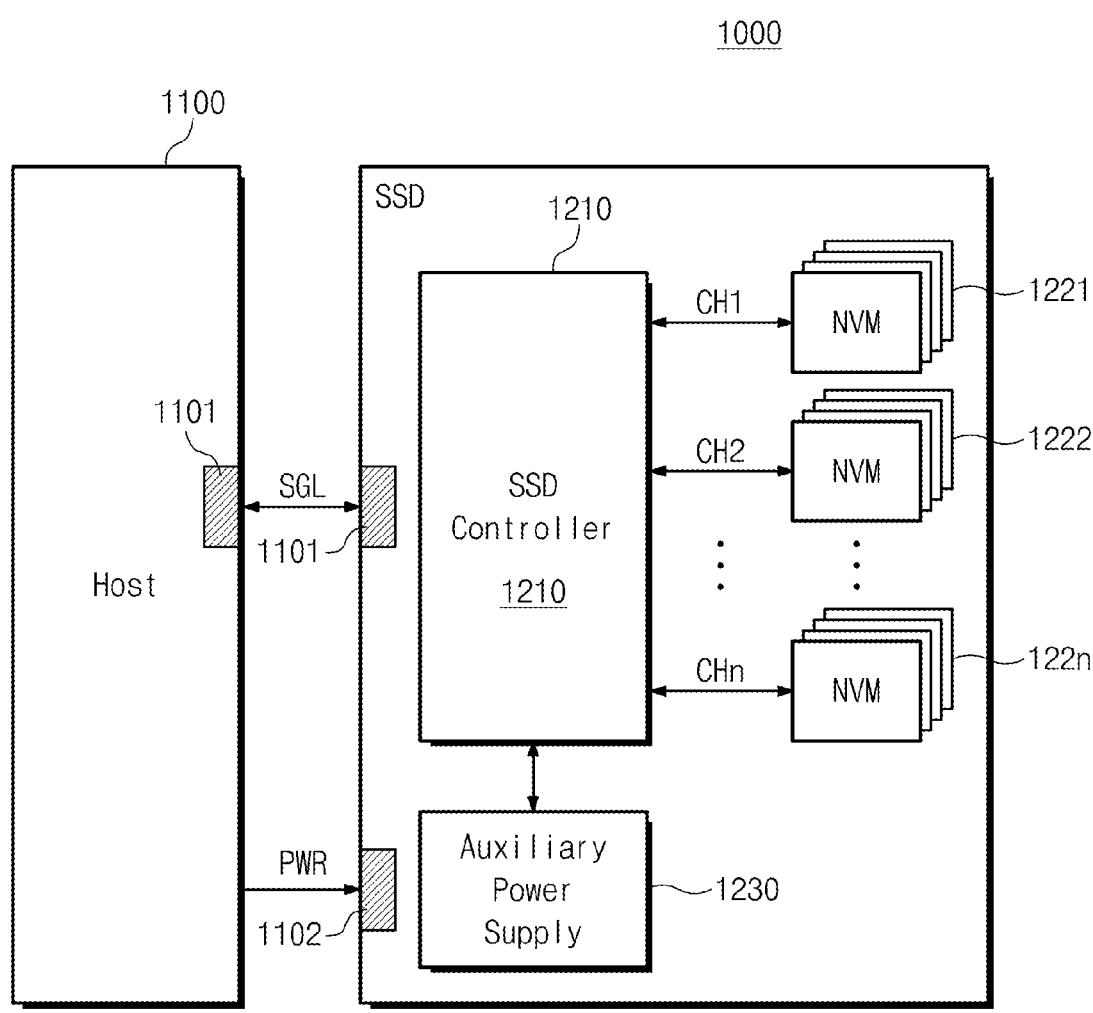
FIG. 19 is a block diagram of a solid-state drive (SSD) comprising a nonvolatile memory device according to an embodiment of the inventive concept.

FIG. 19 is a block diagram of an SSD system 1000 comprising a nonvolatile memory device according to an embodiment of the inventive concept.

Referring to FIG. 19, SSD system 1000 comprises a host 1100 and an SSD 1200. Host 1100 writes data into SSD 2200 or reads data stored in SSD 2200. Host 1100 exchanges a signal SGL such as a command, an address, state information with the SSD 1200 through a host interface 1101. Host interface 1101 may be, for instance, an interface of type USB, MMC, PCI, PCI-E, ATA, Serial-ATA, Parallel-ATA, SCSI, ESDI, IDE, MIPI, or NVMe.

SSD 1200 exchanges signal SGL with host 1100 through host interface 1101, and it receives power through a power connector 2102. SSD 1200 may include a plurality of nonvolatile memory devices 1221 to 122n, an SSD controller 1210, and an auxiliary power supply 1230. Each of the nonvolatile memory devices 1221 to 122n may be implemented using PRAM, MRAM, ReRAM, and FRAM other than a NAND flash memory.

Nonvolatile memory devices 1221 to 122n are used as a storage medium of the SSD 1200. Nonvolatile memory devices 1221 to 122n may be connected to the SSD controller 1210 through a plurality of channels CH1 to CHn. One or more nonvolatile memory devices may be connected to a single channel. The nonvolatile memory devices connected to the single channel may be connected to the same data bus.

SSD controller 1210 exchanges a signal SGL with host 1100 through the host interface 1201. Signals SGL may include a command, an address, data, and the like. SSD controller 1210 writes data into a corresponding nonvolatile memory device or reads data from a corresponding nonvolatile memory device according to the command of host 1100.

Auxiliary power supply 1230 may be connected to host 1100 through a power connector 1202. Auxiliary power supply 1230 may receive power PWR from host 1100 to be charged. Auxiliary power supply 1230 may be disposed inside or outside the SSD 1200. For example, auxiliary power supply 1230 may be disposed on a main board to supply auxiliary power to SSD 1200. SSD 1200 may be, for instance, a nonvolatile memory system as described with reference to FIGS. 1 to 17. That is, the SSD 1200 may perform an on-cell counting operation to adjust a read voltage when a UECC error is detected.

Figure 20:
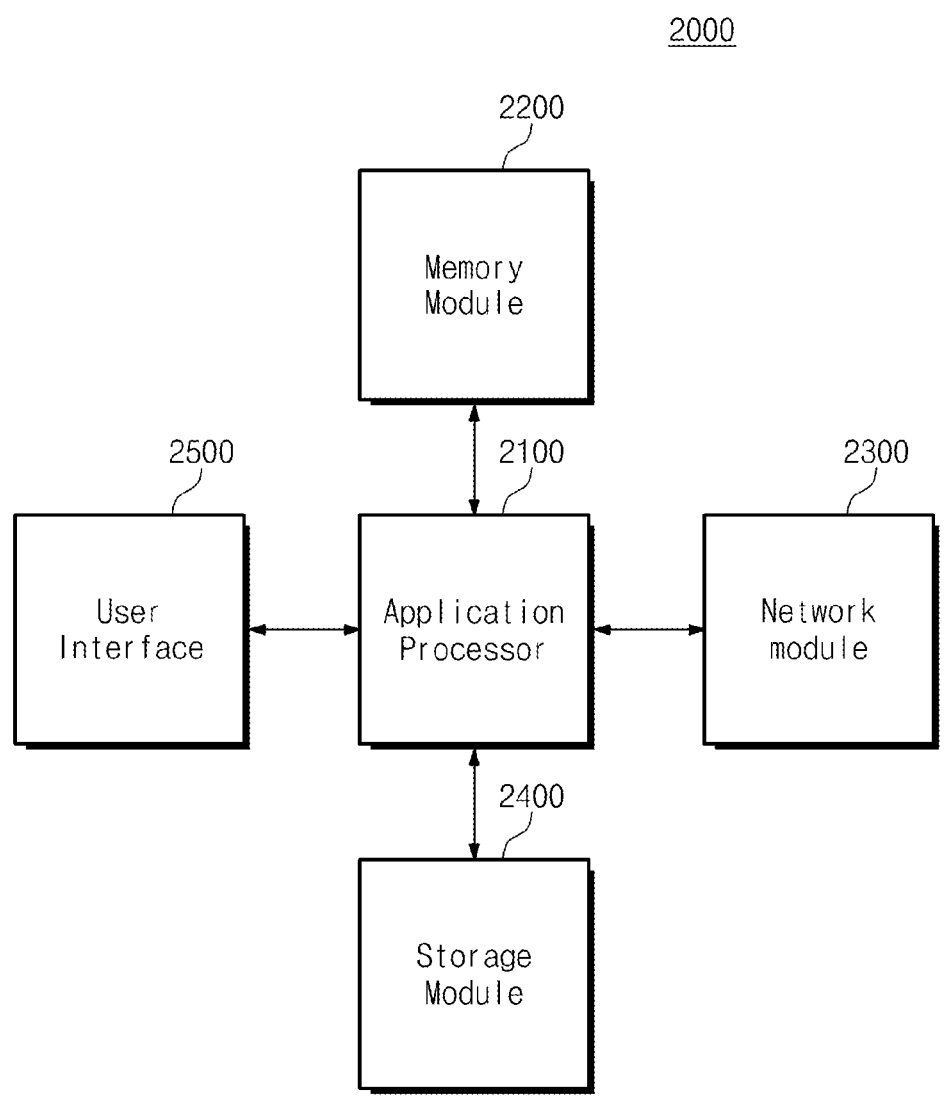
FIG. 20 is a block diagram of a user system comprising a memory system according to an embodiment of the inventive concept.

FIG. 20 is a block diagram of a user system 2000 comprising a memory system according to an embodiment of the inventive concept.

Referring to FIG. 20, user system 2000 comprises an application processor 2100, a memory module 2200, a network module 2200, a storage module 2400, and a user interface 2500. User system 2000 may be, for instance, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) player, a digital audio recorder, a digital audio player, a digital picture recorder, a digital picture player, a digital video recorder, or a digital video player.

Application processor 2100 drives components incorporated in user system 2000, an operating system (OS), and the like. In some embodiments, application processor 2100 comprises controllers to control components incorporated in user system 2000, a graphic engine, and various interfaces.

Memory module 2200 may operate as a main memory, a working memory, a buffer memory or a cache memory of user system 2000. Memory module 2200 may include a volatile random access memory such as DRAM, SDRAM, DDR SDRAM, DDR2 SDRAM, DDR2 SDRAM, LPDDR DRAM, LPDDR2 DRAM, LPDDR2, and DRAM and a nonvolatile random access memory such as PRAM, ReRAM, MRAM, and FRAM.

Network module 2300 may communicate with external devices. In some embodiments, the network module 2300 may support wireless communication such as CDMA, GSM, WCDMA, CDMA-2000, TDMA, LTE, Wimax, WLAN, UWB, Bluetooth, and WI-DI. In some embodiments, the network module 2300 may be embedded in application processor 2100.

Storage module 2400 stores data. For example, storage module 2400 may store externally received data. Alternatively, storage module 2400 may transmit its stored data to application processor 3400. In some embodiments, storage module 2400 may be implemented using a semiconductor memory device such as a phase-change RAM (PRAM), a magnetic RAM (MRAM), a resistive RAM (RRAM), a NAND flash memory, a NOR flash memory, a three-dimensional NAND flash memory.

In some embodiments, storage module 2400 may be a nonvolatile memory system described with reference to FIGS. 1 to 17. Storage module 2400 may operate based on the method described with reference to FIGS. 1 to 17, for example.

User interface 2500 may include interfaces to input data or a command to the user interface 2100 or to output data to an external device. In some embodiments, the user interface 2500 may include input devices such as a camera, a touch screen, an operation recognition module, and a microphone or output devices such as a display, a speaker, and a touch screen.

As indicated by the foregoing, in certain embodiments of the inventive concept, a nonvolatile memory system detects an error of read data. Where a UECC error is detected, the nonvolatile memory system performs an on-cell counting operation to detect the number of on-cells. The nonvolatile memory system detects elapsed program time of a wordline in which the read data is stored, based on the detected number of on-cells. Alternatively, the nonvolatile memory system may adjust a read voltage of a nonvolatile memory device such that the nonvolatile memory device performs a read operation with a desired read voltage. Thus, a UECC error caused by IVS may be prevented. Moreover, because a separate storage space to store program time is not required, utilization of the storage space is improved. Thus, a nonvolatile memory device with improved reliability, improved performance, and reduced cost is provided.

As described above, a nonvolatile memory system according to some embodiments of the inventive concept may adjust a read voltage based on an on-cell counting operation although program time is not written to a separate nonvolatile memory area. Thus, a nonvolatile memory device with improved reliability, improved performance, and reduced cost and an operation method thereof may be provided. The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A nonvolatile memory system comprising:
a nonvolatile memory device comprising at least one three dimensional memory block, wherein the at least one three dimensional memory block including a plurality of strings connected between a bit line and a common source line, each of the plurality of strings including a plurality of memory cells connected in a series, each of the plurality of memory cells being connected to word lines stacked in a direction perpendicular to a substrate, and configured to read data from the plurality of memory cells using a plurality of read voltages; and
a memory controller configured to generate a read command to read first memory cells among memory cells of the nonvolatile memory device using the plurality of read voltages, and to generate a counting command to read second memory cells among the memory cells of the nonvolatile memory device using at least one reference voltage to obtain at least one cell-count data from the read second memory cells and adjust the read voltages of the nonvolatile memory device based on the generated at least one cell-count data,
wherein the counting command is different from the read command, and the counting command is generated when data read from the first memory cells in response to the read command is uncorrectable data, and is not generated when the data read from the first memory cells in response to the read command is correctable data.

2. The nonvolatile memory system of claim 1, wherein the memory controller comprises an error correction code engine configured to detect an error in data read from the first memory cells and correct the detected error when the detected error is correctable.

3. The nonvolatile memory system of claim 2, wherein the memory controller is responsive to an uncorrectable error by the error correction code engine to generate the counting command and to adjust the read voltages.

4. The nonvolatile memory system of claim 3, wherein the memory controller is configured to generate another read command, after the counting command, to again read the first memory cells among the memory cells of the nonvolatile memory device using the adjusted read voltages.

5. The nonvolatile memory system of claim 1, wherein the at least one reference voltage is included in a range between a threshold voltage distribution corresponding to one among a plurality of program states and a threshold voltage distribution corresponding to a program state adjacent to the one of the plurality of program states.

6. The nonvolatile memory system of claim 1, wherein the at least one reference voltage is lower than a lower limit of a threshold voltage distribution corresponding to uppermost program state among a plurality of program states.

7. The nonvolatile memory system of claim 1, wherein the memory controller is further configured to detect a number of on-cells based on the generated cell-count data.

8. The nonvolatile memory system of claim 7, wherein the memory controller comprises a Random Access Memory (RAM) storing a look-up table (LUT) indicating a relationship between the number of on-cells and the read voltages,
wherein the memory controller is configured to adjust the plurality of read voltages based on the LUT and the detected number of on-cells.

9. The nonvolatile memory system of claim 8, wherein the LUT is predetermined according to positions of the at least one three dimensional memory block or word lines.

10. The nonvolatile memory system of claim 8, wherein the memory controller is configured to update the LUT according to a number of program and erase cycles of the at least one three dimensional memory block.

11. The nonvolatile memory system of claim 1, wherein the memory controller comprises a randomizer configured to randomize data to be stored in the plurality of memory cells.

12. An operation method of a nonvolatile memory system comprising a memory controller and a nonvolatile memory device including at least one three dimensional memory block, wherein the at least one three dimensional memory block including a plurality of strings connected between a bit line and a common source line, each of the plurality of strings including a plurality of memory cells connected in a series, each of the plurality of memory cells being connected to word lines stacked in a direction perpendicular to a substrate, the operation method comprising:
reading, in response to a first read command, data stored in first memory cell in the nonvolatile memory device using a plurality of read voltages;
detecting an error of the data read in response to the first read command;
reading, when the error of the data read in response to the first read command is not correctable and in response to a counting command, second memory cells in the nonvolatile memory device using at least one reference voltage to generate at least one cell-count data, and adjusting the plurality of read voltages of the nonvolatile memory device based on the generated at least one cell-count data; and
reading, in response to a second read command, data stored in the memory cells in the nonvolatile memory device using the adjusted read voltages,
wherein the first and second read commands are different than the counting command.

13. The operation method of claim 12, wherein the adjusting the plurality of read voltages of the nonvolatile memory device based on the generated at least one cell-count data comprises detecting a number of on-cells based on the generated cell-count data to adjust the plurality of read voltages based on the number of on-cells.

14. The operation method of claim 12, further comprises:
correcting the error of the data read in response to the first read command when the error is correctable.

15. The operation method of claim 12, wherein the reading data stored in the memory cells in response to the first and second read commands comprises:
determining whether there is a record; and
reading the data based on the plurality of read voltages where there is no record, and reading the data based on the adjusted read voltages where there is the record,
wherein the record indicates whether the plurality of read voltages are adjusted at previously read operations.

16. The operation method of claim 15 further comprises updating the record where the plurality of read voltages are adjusted based on the generated cell-count data.

17. A storage device comprising:
at least one flash memory device comprising at least one three dimensional memory block, wherein the at least one three dimensional memory block including a plurality of strings connected between a bit line and a common source line, each of the plurality of strings including a plurality of memory cells connected in a series, each of the plurality of memory cells being connected to word lines stacked in a direction perpendicular to a substrate, and configured to read out data stored in the plurality of memory cells using a plurality of read voltages; and
a memory controller configured to control the at least one flash memory device, to generate a first read command to generate read data from memory cells of the at least one flash memory device, and, when the read data includes an uncorrectable error, to generate a counting command to perform a cell-counting operation of the at least one flash memory device using at least one reference voltage, and adjust the plurality of read voltages based on a result of the cell-counting operation, and to generate a second read command to read the memory cells of the at least one flash memory device using the adjusted plurality of read voltages, wherein the counting command is different than the first and second read commands.

18. The storage device of claim 17, wherein the cell-count operation comprises an operation of reading memory cells connected with one of the word lines using the at least one reference voltage and detecting a number of on-cells among the memory cells connected with the one of the word lines.

* * * * *